(12) United States Patent
Han et al.

(10) Patent No.: US 12,239,004 B2
(45) Date of Patent: Feb. 25, 2025

(54) DISPLAY PANEL, PACKAGED EVAPORATION SHADOW MASK, DISPLAY DEVICE AND PREPARATION METHOD

(71) Applicants: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(72) Inventors: Bing Han, Shanghai (CN); Yu Xin, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 849 days.

(21) Appl. No.: 17/376,340

(22) Filed: Jul. 15, 2021

(65) Prior Publication Data
US 2022/0262873 A1 Aug. 18, 2022

(30) Foreign Application Priority Data
Feb. 18, 2021 (CN) .......................... 202110190247.4

(51) Int. Cl.
*H10K 59/88* (2023.01)
*C23C 14/04* (2006.01)
(Continued)

(52) U.S. Cl.
CPC ........... *H10K 59/88* (2023.02); *C23C 14/042* (2013.01); *C23C 14/24* (2013.01); *H10K 50/19* (2023.02);
(Continued)

(58) Field of Classification Search
CPC ........ H10K 50/19; H10K 59/88; H10K 59/35; H10K 59/353; H10K 59/122;
(Continued)

(56) References Cited

U.S. PATENT DOCUMENTS 11,678,557 B2 * 6/2023 Hu ........................ H10K 71/135
257/40
2006/0267481 A1 * 11/2006 Chang .................... H01J 31/123
313/496
(Continued)

FOREIGN PATENT DOCUMENTS

CN 102169260 A * 8/2011 ....... G02F 1/134336
CN 105280842 A 1/2016
(Continued)

*Primary Examiner* — Ida M Soward
(74) *Attorney, Agent, or Firm* — KDW Firm PLLC

(57) ABSTRACT

A display panel includes a display area and a non-display area; the display area includes multiple first sub-pixel minimum repeating units; the multiple first sub-pixel minimum repeating units are sequentially and periodically arranged in a first direction, and in the first direction, a center distance between any two adjacent ones of the multiple first sub-pixel minimum repeating units is d1; the non-display area includes a first offset mark A1 and a second offset mark A2 arranged in the first direction; a center distance L1 between the first offset mark A1 and the second offset mark A2 is an integral multiple of the center distance d1 between the first sub-pixel minimum repeating units.

28 Claims, 14 Drawing Sheets

(51) Int. Cl.
  *C23C 14/24* (2006.01)
  *H10K 50/19* (2023.01)
  *H10K 71/00* (2023.01)
  *H10K 71/16* (2023.01)
  *H01L 21/68* (2006.01)
  *H10K 59/121* (2023.01)
  *H10K 59/122* (2023.01)

(52) U.S. Cl.
  CPC ............ *H10K 71/00* (2023.02); *H10K 71/164* (2023.02); *H10K 71/166* (2023.02); *H01L 21/68* (2013.01); *H01L 21/682* (2013.01); *H10K 59/121* (2023.02); *H10K 59/122* (2023.02)

(58) Field of Classification Search
  CPC .... H10K 59/121; H10K 71/00; H10K 71/164; H10K 71/166; H10K 71/70; C23C 14/042; C23C 14/24; C23C 14/52; C23C 14/54; H01L 21/67253; H01L 21/67259; H01L 21/682; H01L 21/68; H01L 23/544
  See application file for complete search history.

(56) References Cited

U.S. PATENT DOCUMENTS

| 2014/0084258 | A1* | 3/2014 | Choi | H10K 71/135 |
| | | | | 257/40 |
| 2019/0305221 | A1* | 10/2019 | Hou | H10K 59/122 |
| 2021/0091153 | A1* | 3/2021 | Jia | H10K 59/122 |

FOREIGN PATENT DOCUMENTS

| CN | 108122957 A | * | 6/2018 | ......... H01L 27/3206 |
| CN | 109055892 A | * | 12/2018 | ............ C23C 14/042 |
| CN | 108977762 B | | 12/2019 | |
| CN | 112151592 A | * | 12/2020 | ............ G09G 3/3225 |
| JP | 2011159706 A | * | 8/2011 | ............. H01L 21/76 |
| WO | WO-2019062580 A1 | * | 4/2019 | ......... H01L 27/3246 |

* cited by examiner

DISPLAY PANEL, PACKAGED EVAPORATION SHADOW MASK, DISPLAY DEVICE AND PREPARATION METHOD

CROSS-REFERENCE TO RELATED APPLICATION

This application claims priority to Chinese Patent Application No. 202110190247.4 filed Feb. 18, 2021, the disclosure of which is incorporated herein by reference in its entirety.

TECHNICAL FIELD

The present disclosure relate to the field of display technologies and, in particular, to a display panel, a packaged evaporation shadow mask, a display device, and a preparation method.

BACKGROUND

FIG. 1 is a structure diagram of film layers of an existing OLED display panel. First, referring to FIG. 1, an OLED device in the existing OLED display panel includes not only red, green, and blue light-emitting layers, but also corresponding compensation layers. The light-emitting layer and the compensation layer in the same OLED device have exactly the same shape and are respectively prepared by using two different evaporation shadow masks whose main evaporation areas have the same opening. In each of the two different evaporation shadow masks, an offset mark opening is disposed around an edge area of the main evaporation area to form an offset mark while the light-emitting layer or the compensation layer is evaporated. However, the positions of the offset mark openings of the two different evaporation shadow masks are different so that the position of the offset mark for the light-emitting layer evaporated on the display panel is different from the position of the offset mark for the compensation layer evaporated on the display panel. In this manner, whether there is a misalignment when the evaporation shadow mask is nested with an array substrate is detected through the offset marks. It is to be understood that the relative offset of the evaporation shadow mask and the array substrate causes the evaporation of the light-emitting layer or the compensation layer to be misaligned, leading to serious color mixing or color lack. Therefore, how to accurately and effectively measure the offset of the evaporated film and compensate for the offset is very important to achieve the preceding requirement.

The existing offset detection method is to dispose an offset mark opening in an edge area of each of six evaporation shadow masks for evaporating the light-emitting layer and the compensation layer, where the positions of the offset marks are staggered, that is, after the light-emitting layers and the compensation layers are evaporated, six staggered offset marks are formed in a non-display area of the display panel. By comparing the actual positions of the six offset marks with the theoretical positions of the six offset marks, the offsets of the evaporation shadow masks may be determined. However, the evaporation shadow mask is a fine metal mask. The process of preparing the OLED display panel through six evaporation shadow masks is relatively complicated, the number of evaporation shadow masks is relatively great, and the cost is relatively high, leading to an increase in the project cost.

SUMMARY

The present disclosure provides a display panel, a packaged evaporation shadow mask, a display device, and a preparation method so that the accurate measurement of the offset of an OLED display panel can be achieved while the process cost of the offset measurement can be reduced.

In a first aspect, the present disclosure provides a display panel. The display panel includes a display area and a non-display area located at a periphery of the display area.

The display area includes multiple first sub-pixel minimum repeating units; the multiple first sub-pixel minimum repeating units are sequentially and periodically arranged in a first direction, and in the first direction, a center distance between any two adjacent ones of the multiple first sub-pixel minimum repeating units is d1; each of the multiple first sub-pixel minimum repeating units includes at least one first sub-pixel.

The non-display area includes a first offset mark group and a second offset mark group, the first offset mark group includes a first offset mark A1, and the second offset mark group includes a second offset mark A2: the first offset mark A1 and the second offset mark A2 are arranged in the first direction, and a center distance L1 between the first offset mark A1 and the second offset mark A2 satisfies: $L1 = m \times d1 \pm t1$; where t1 is a first preset offset value; m is an integer greater than or equal to 1.

In a second aspect, the present disclosure further provides a packaged evaporation shadow mask. Any display panel described in the first aspect is formed by using the packaged evaporation shadow mask. The packaged evaporation shadow mask includes a first evaporation shadow mask.

The first evaporation shadow mask includes a first evaporation area and a second evaporation area.

The first evaporation area includes a common area, a first shift area, and a second shift area, and the first shift area and the second shift area are respectively located on two opposite sides of the common area; the common area, the first shift area, and the second shift area are each provided with multiple sub-pixel minimum repeating unit openings with exactly the same shape and size, and each of the multiple sub-pixel minimum repeating unit openings includes at least one sub-pixel opening; a sub-pixel minimum repeating unit opening pattern formed by the sub-pixel minimum repeating unit openings in the first shift area and the common area is the same as a sub-pixel minimum repeating unit opening pattern formed by the sub-pixel minimum repeating unit openings in the common area and the second shift area.

The second evaporation area is located at a periphery of the first evaporation area, and the second evaporation area includes an offset mark opening.

The sub-pixel minimum repeating unit openings of the first shift area and the common area of the first evaporation shadow mask have exactly the same shape, size, and number as the first sub-pixel minimum repeating units in the display panel and are aligned in one-to-one correspondence with the first sub-pixel minimum repeating units in the display panel.

The offset mark opening in the first evaporation shadow mask is configured to form the first offset mark A1 and the second offset mark A2 in the display panel.

In a third aspect, the present disclosure further provides a preparation method of a display panel. The display panel described in the first aspect is prepared by using any packaged evaporation shadow mask described in the second aspect. The preparation method of the display panel includes the steps described below.

A base substrate is provided.

A first compensation layer is deposited on the base substrate by using a first evaporation shadow mask in the packaged evaporation shadow mask according to a sub-pixel minimum repeating unit opening pattern, with a first offset mark A1 formed at the same time.

The first evaporation shadow mask is moved by a distance of m×d1 in a first direction, and a first light-emitting layer is deposited on the base substrate according to the sub-pixel minimum repeating unit opening pattern, a second offset mark A2 formed at the same time, where d1 is a center distance between any two adjacent ones of multiple sub-pixel minimum repeating unit openings in the first evaporation shadow mask in the first direction, and m is an integer greater than or equal to 1.

In a fourth aspect, the present disclosure is further provided with a display device. The display device includes any display panel described in the first aspect.

DETAILED DESCRIPTION

Figure 1:
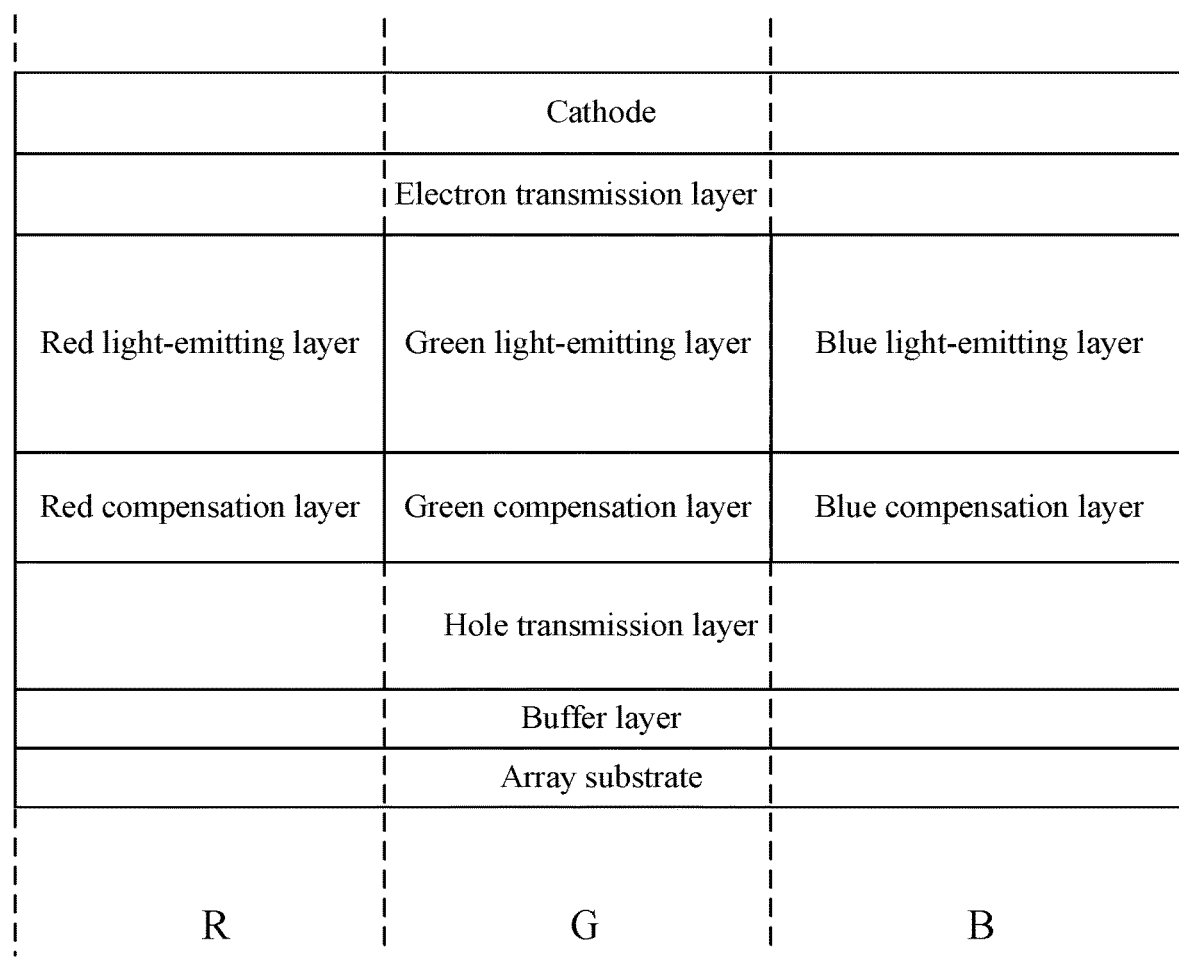
FIG. 1 is a structure diagram of film layers of an existing OLED display panel.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

As mentioned in the background, in the existing method for measuring the offset of a shadow mask, multiple evaporation shadow masks are generally used to prepare respective offset marks, leading to the relatively high cost of the offset measurement. In view of the above problem, embodiments of the present disclosure provide a packaged evaporation shadow mask and also correspondingly provide a display panel and a preparation method of the display panel. The display panel is prepared by using the packaged evaporation shadow mask provided in embodiments of the present disclosure, and in the preparation method of the display panel, the packaged evaporation shadow mask is used. First, the display panel includes a display area and a non-display area located at a periphery of the display area.

The display area includes multiple first sub-pixel minimum repeating units; the multiple first sub-pixel minimum repeating units are sequentially and periodically arranged in a first direction, and in the first direction, a center distance between any two adjacent ones of the multiple first sub-pixel minimum repeating units is d1; each of the multiple first sub-pixel minimum repeating units includes at least one first sub-pixel.

The non-display area includes a first offset mark group 25 and a second offset mark group 26, the first offset mark group 25 includes a first offset mark A1, and the second offset mark group 26 includes a second offset mark A2; the first offset mark A1 and the second offset mark A2 are arranged in the first direction, and a center distance L1 between the first offset mark A1 and the second offset mark A2 satisfies: $L1=m \times d1 \pm t1$; where t1 is a first preset offset value, and m is an integer greater than or equal to 1.

Figure 2:
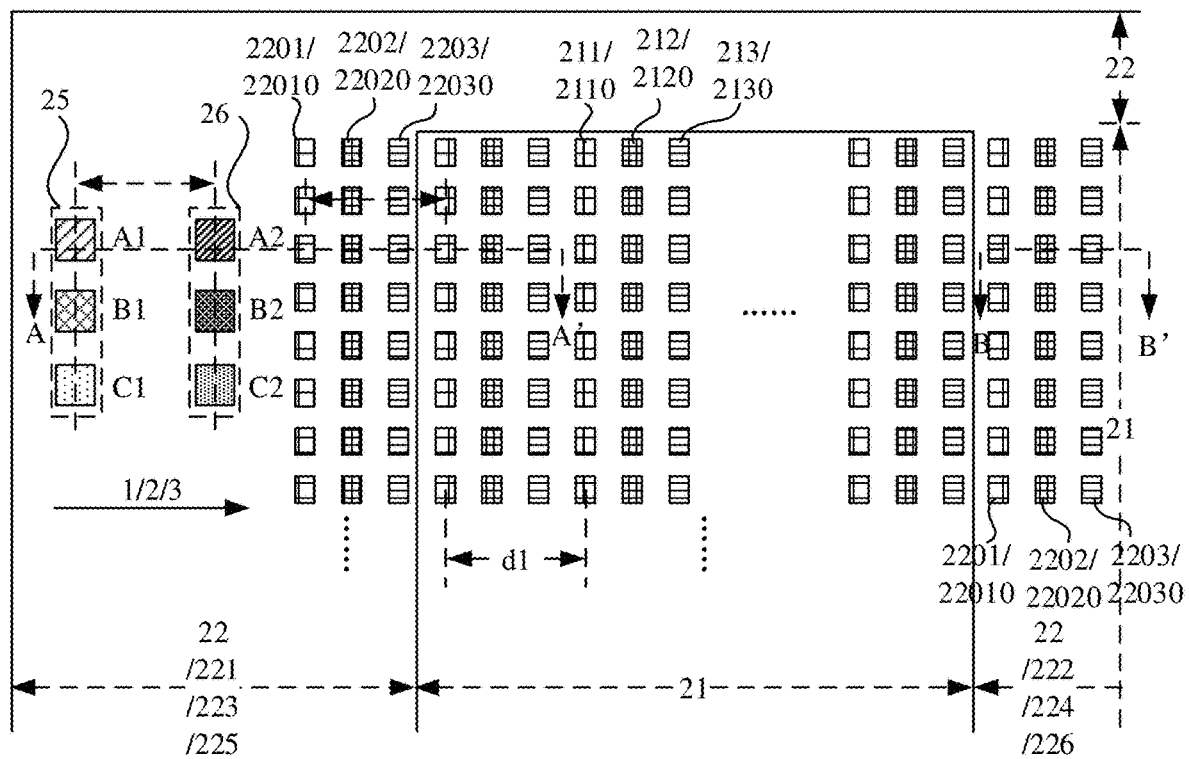
FIG. 2 is a partial structure diagram of a display panel according to an embodiment of the present disclosure.

Hereinafter the display panel provided in embodiments of the present disclosure is illustrated and described with the drawings. FIG. 2 is a partial structure diagram of a display panel according to an embodiment of the present disclosure. First, referring to FIG. 2, the display panel 20 includes a display area 21 and a non-display area 22 located at a periphery of the display area 21; the display area 21 includes multiple first sub-pixel minimum repeating units 211; the multiple first sub-pixel minimum repeating units 211 are sequentially and periodically arranged in a first direction 1, and in the first direction 1, a center distance between any two adjacent ones of the multiple first sub-pixel minimum repeating units 211 is d1; each of the multiple first sub-pixel minimum repeating units 211 includes at least one first sub-pixel 2110; the non-display area 22 includes a first offset mark group 25 and a second offset mark group 26 (as shown at two dashed-line boxes), the first offset mark group 25 includes a first offset mark A1, and the second offset mark group 26 includes a second offset mark A2.

The first offset mark A1 and the second offset mark A2 are arranged in the first direction 1, and a center distance L1 between the first offset mark A1 and the second offset mark A2 satisfies: $L1\ m \times d1 \pm t1$; where t1 is a first preset offset value; m is an integer greater than or equal to 1.

Each of the multiple first sub-pixel minimum repeating units 211 is essentially a sub-pixel combination formed by a sub-pixel(s) with a specific color disposed on the display panel and includes at least one sub-pixel. Moreover, the sub-pixel combination of the same color exhibits a characteristic of periodic arrangement in a certain direction of the entire display area, that is, the multiple first sub-pixel minimum repeating units 211 are arranged periodically in the first direction 1. In other words, when any one sub-pixel combination of a specific color is moved by a periodic distance in a periodic arrangement direction, the sub-pixel combination of the specific color can overlap with another adjacent sub-pixel combination of the same color. By way of example, using all the first sub-pixel minimum repeating units 211 as a whole, it is to be understood that when all the first sub-pixel minimum repeating units 211 are moved by one or more periodic distances in the first direction 1, the first sub-pixel minimum repeating units 211 in a middle area (not including the part of the first sub-pixel minimum repeating units 211 in an edge area) overlap with the first sub-pixel minimum repeating units 211 before movement. In this embodiment, for the sub-pixel combination of the same color, each sub-pixel combination may be understood as the same sub-pixel combination sequentially moved by the same distance and obtained by multiple copies, so each sub-pixel combination is called a sub-pixel minimum repeating unit.

The offset mark actually refers to a pattern mark formed on the non-display area 22 of the display panel. The offset mark and a light-emitting layer or a compensation layer of a sub-pixel in the sub-pixel minimum repeating unit are formed by using the same evaporation shadow mask in the same evaporation step, that is, the relative position of the offset mark pattern and the sub-pixel minimum repeating unit pattern is fixed. In the case where the evaporation shadow mask and an array substrate are not aligned correctly, the light-emitting layer or the compensation layer formed by evaporation is misaligned, and the offset mark is also misaligned. Therefore, by detecting the offset between the position of the offset mark and the theoretical position of the offset mark, whether the light-emitting layer or the compensation layer in the sub-pixel of the sub-pixel minimum repeating unit is offset can be determined.

The following describes the specific process of the display panel of embodiments of the present disclosure for detecting the offset based on the offset mark by using the first offset mark A1 and the second offset mark A2 patterns. The first offset mark A1 and the second offset mark A2 are essentially prepared by using the same offset mark opening on the same evaporation shadow mask. The difference is that the first offset mark A1 and the second offset mark A2 are respectively formed in two process steps, and when the second offset mark A2 is formed, there is an active positional movement of the evaporation shadow mask with respect to the array substrate. In other words, the patterns of the first offset mark A1 and the second offset mark A2 formed on the array substrate are exactly the same, and only the position is changed. It is to be understood that, for the second offset mark A2, even if the evaporation shadow mask is shifted with respect to the array substrate, the theoretical position of the second offset mark A2 can also be determined in the case where a shift distance is known; the offset of the second offset mark A2 can also be determined based on the theoretical position and the actual position of the second offset mark A2. Further, it is to be understood that the offset of the first offset mark A1 and the offset of the second offset mark A2 actually respectively represent the offsets of sub-pixel film layers in the sub-pixel minimum repeating units formed by using the same evaporation shadow mask as the first offset mark A1 and the second offset mark A2. Taking as an example the case where the first offset mark A1 and a compensation layer of a sub-pixel in a sub-pixel minimum repeating unit are prepared by evaporation simultaneously and the second offset mark A2 and a light-emitting layer of the sub-pixel in the sub-pixel minimum repeating unit are prepared by evaporation simultaneously, the offset of the first offset mark A1 indicates the offset of the compensation layer of the sub-pixel in the sub-pixel minimum repeating unit, and the offset of the second offset mark A2 indicates the offset of the light-emitting layer of the sub-pixel in the sub-pixel minimum repeating unit.

It is to be noted that since the first offset mark A1 and the second offset mark A2 are formed in two evaporation processes by using the same evaporation shadow mask, after the evaporation shadow mask is shifted, it is necessary to ensure that a sub-pixel minimum repeating unit opening on the evaporation shadow mask is still aligned with a pixel defining unit on the array substrate to form the light-emitting layer of the sub-pixel minimum repeating unit. Therefore, a center distance between two offset marks, that is, a shift distance of the evaporation shadow mask in two evaporation processes, needs to be set to an integral multiple of a sub-pixel minimum repeating unit arrangement period. In this case, the center distance L1 between the first offset mark A1 and the second offset mark A2 should be equal to m times the center distance d1 between any two adjacent ones of the multiple first sub-pixel minimum repeating units 211. Further, it is to be understood that in the actual preparation process, when the evaporation shadow mask is shifted in the second evaporation process, there may be a problem of insufficient shift accuracy, that is, when the evaporation shadow mask is shifted, a process error is introduced in the center distance between the first offset mark and the second offset mark. Therefore, from the perspective of strict measurement, the actual distance between the formed first offset mark and the formed second offset mark is equal to an integral multiple of the arrangement period of the corresponding adjacent sub-pixel minimum repeating units in a shift direction of the evaporation shadow mask plus or minus the process error. By way of example, under the actual process condition, the process error is generally within 10 μm. In this embodiment, the center distance L1 between the first offset mark A1 and the second offset mark A2 is set to satisfy: $L1=m \times d1 \pm t1$, where t1 denotes to the first preset offset value, that is, a preset process error value, and t1 may be a value less than or equal to 10 μm. In this case, the center distance L1 between the first offset mark A1 and the second offset mark A2 is within the range of [$m \times d1-10$ μm, $m \times d1+10$ μm].

With continued reference to FIG. 2, the display area 21 may further include multiple second sub-pixel minimum repeating units 212; the multiple second sub-pixel minimum repeating units 212 are sequentially and periodically arranged in a second direction 2, and in the second direction 2, a center distance between any two adjacent ones of the multiple second sub-pixel minimum repeating units 212 is d2; each of the multiple second sub-pixel minimum repeating units 212 includes at least one second sub-pixel 2120, and a color of the at least one first sub-pixel 2110 is different from a color of the at least one second sub-pixel 2120.

A first offset mark B1 and a second offset mark B2 are arranged in the second direction 2, and a center distance L2 between the first offset mark B1 and the second offset mark B2 satisfies: $L2=n \times d2 \pm t2$; where t2 is a second preset offset value, and n is an integer greater than or equal to 1.

Similarly, each of the multiple second sub-pixel minimum repeating units 212 includes at least one second sub-pixel 2120 of a specific color, and a color of the second sub-pixel 2120 is different from the color of the at least one first sub-pixel 2110. Each second sub-pixel minimum repeating unit 212 is a sub-pixel combination formed by the at least one second sub-pixel 2120, and when any one sub-pixel combination of a specific color is moved by a periodic distance in a periodic arrangement direction, that is, the second direction, the sub-pixel combination of the specific color can overlap with another adjacent sub-pixel combination of the same color. Moreover, similarly, the first offset mark B1 and the second offset mark B2 are essentially prepared and formed by using the same offset mark opening on the same evaporation shadow mask, the patterns of the first offset mark B1 and the second offset mark B2 formed on the array substrate are exactly the same, and only the position is changed. It is to be understood that, for the second offset mark B2, even if the evaporation shadow mask is shifted with respect to the array substrate, the theoretical position of the second offset mark B2 can also be determined in the case where a shift distance is known; the offset of the second offset mark B2 can also be determined based on the theoretical position and the actual position of the second offset mark B2. Moreover, since the first offset mark B1 and the second offset mark B2 are formed in two evaporation processes by using the same evaporation shadow mask, after the evaporation shadow mask is shifted, it is necessary to ensure that a sub-pixel minimum repeating unit opening on the evaporation shadow mask is still aligned with a pixel defining unit on the array substrate. Therefore, a center distance between the two offset marks needs to be an integral multiple of a sub-pixel minimum repeating unit arrangement period, that is, the center distance L2 between the first offset mark B1 and the second offset mark B2 should be equal to n times the center distance d2 between any two adjacent ones of the multiple second sub-pixel minimum repeating units 212.

Similarly, due to the problem of insufficient shift accuracy of the evaporation shadow mask in the actual preparation process, a process error is introduced in the center distance between the first offset mark and the second offset mark. From the perspective of strict measurement, the actual distance between the formed first offset mark B1 and the formed second offset mark B2 is equal to an integral multiple of the arrangement period of the corresponding adjacent sub-pixel minimum repeating units in a shift direction of the evaporation shadow mask plus or minus the process error. In this embodiment, the center distance L2 between the first offset mark B1 and the second offset mark B2 is set to satisfy: $L2=n \times d2 \pm t2$, where t2 denotes to the second preset offset value, that is, a preset process error value, and t2 may be a value less than or equal to 10 μm.

Further, the display area 21 may further include multiple third sub-pixel minimum repeating units 213; the multiple third sub-pixel minimum repeating units 213 are sequentially and periodically arranged in a third direction 3, and in the third direction 3, a center distance between any two adjacent ones of the multiple third sub-pixel minimum repeating units 213 is d3; each of the multiple third sub-pixel minimum repeating units 213 includes at least one third sub-pixel 2130, and the color of the at least one first sub-pixel 2110, the color of the at least one second sub-pixel 2120, and a color of the at least one third sub-pixel 2130 are different.

The first offset mark group 25 further includes a first offset mark C1, and the second offset mark group 26 further includes a second offset mark C2: the first offset mark C1 and the second offset mark C2 are arranged in the third direction, and a center distance L3 between the first offset mark C1 and the second offset mark C2 satisfies: $L3=p \times d3 \pm t3$, where t3 is a third preset offset value, and p is an integer greater than or equal to 1.

Each of the multiple third sub-pixel minimum repeating units 213 is a sub-pixel combination formed by at least one third sub-pixel of another specific color, and the sub-pixel combination is periodically arranged in the third direction 3. In this case, when any one sub-pixel combination of the specific color is moved by a periodic distance in a periodic arrangement direction, that is, the third direction, the sub-pixel combination of the specific color can overlap with another adjacent sub-pixel combination of the same color. Similarly, for the measurement of the offset of the film layer in the third sub-pixel, the first offset mark C1 disposed in the non-display area and one of two film layers of the third sub-pixel are prepared by evaporation simultaneously, and the second offset mark C2 disposed in the non-display area and the other one of the two film layers of the third sub-pixel are prepared by evaporation simultaneously, so that the offset of the simultaneously prepared film layer may be determined by comparing the actual position of the offset mark with the theoretical position of the offset mark, which will not be repeated herein.

It is to be noted that in this embodiment, the center distance L3 between the first offset mark C1 and the second offset mark C2 is set to satisfy: $L3=p \times d3 \pm t3$, where t3 denotes to the third preset offset value, that is, a preset process error value, and t3 may be a value less than or equal to 10 μm.

Figure 3:
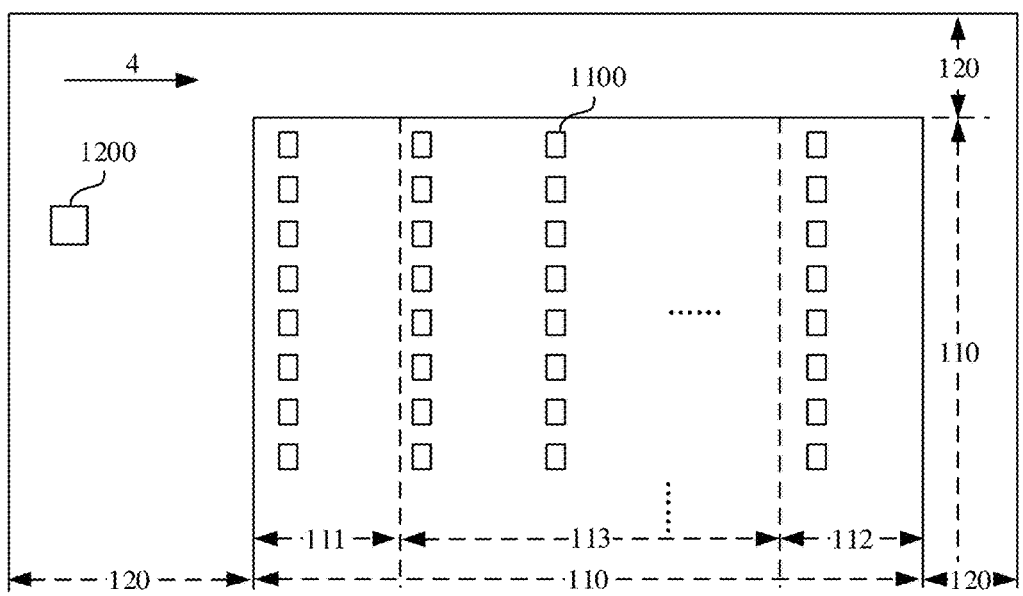
FIGS. 3 to 5 are partial structure diagrams of three evaporation shadow masks in a packaged evaporation shadow mask according to an embodiment of the present disclosure.
Figure 4:
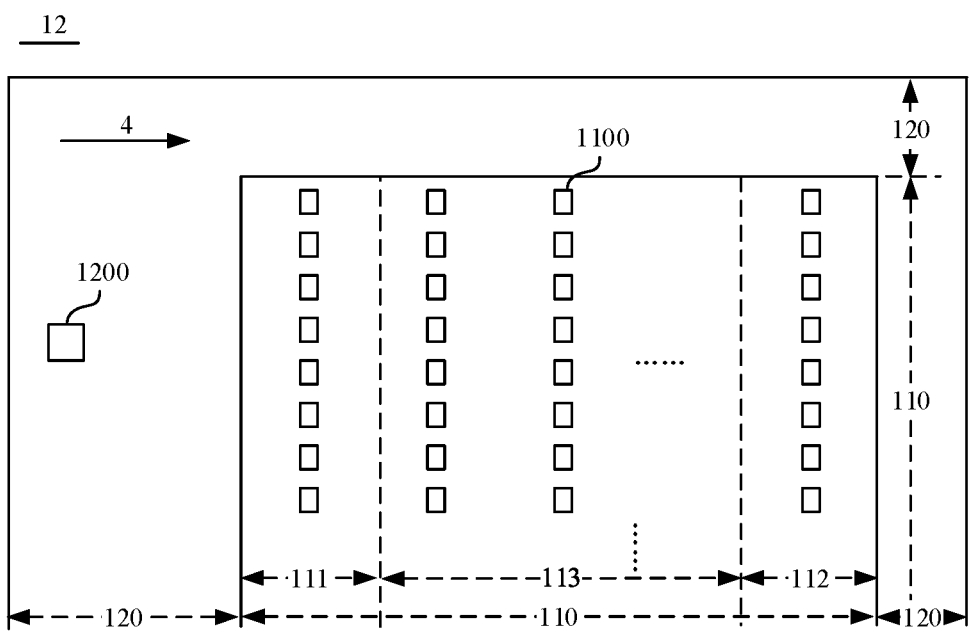
Figure 5:
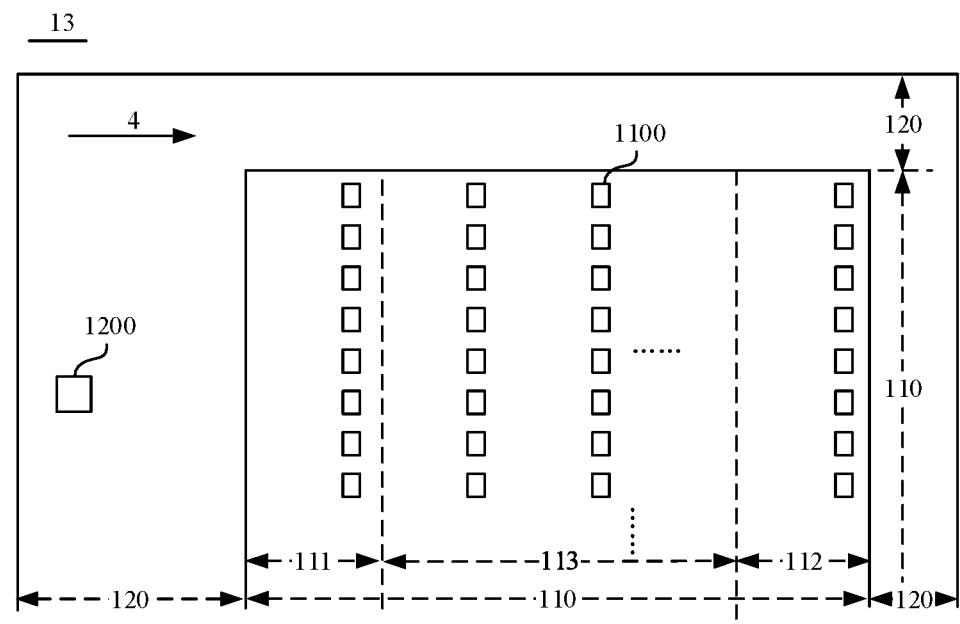
Figure 6:
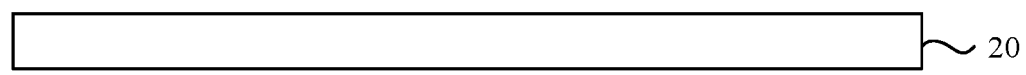
FIG. 6 is a structure diagram of the display panel shown in FIG. 2 and an evaporation mask of an evaporation shadow mask.
Figure 6:

Hereinafter the evaporation shadow mask provided in embodiments of the present disclosure will be described in detail. FIGS. 3 to 5 are partial structure diagrams of three evaporation shadow masks in a packaged evaporation shadow mask according to an embodiment of the present disclosure, and FIG. 6 is a structure diagram of the display panel shown in FIG. 2 and an evaporation shadow mask of an evaporation mask. First, referring to FIGS. 2, 3, and 6, the packaged evaporation shadow mask is configured to prepare any display panel 20 provided in embodiments of the present disclosure; the packaged evaporation shadow mask includes a first evaporation shadow mask 11; the first evaporation shadow mask 11 includes a first evaporation area 110 and a second evaporation area 120 located at a periphery of the first evaporation area 110.

The first evaporation area 110 includes a common area 113, a first shift area 111, and a second shift area 112, and the first shift area 111 and the second shift area 112 are respectively located on two sides of the common area 113; the common area 113, the first shift area 111, and the second shift area 112 are all provided with multiple sub-pixel minimum repeating unit openings 1100 with exactly the same shape and size; a sub-pixel minimum repeating unit opening pattern formed by the sub-pixel minimum repeating unit openings 1100 of the first shift area 111 and the common area 113 is the same as a sub-pixel minimum repeating unit opening pattern formed by the sub-pixel minimum repeating unit openings 1100 of the common area 113 and the second shift area 112. The second evaporation area 120 includes an offset mark opening 1200.

The sub-pixel minimum repeating unit openings 1100 of the first shift area 111 and the common area 113 of the first evaporation shadow mask 11 have exactly the same shape, size and number as the first sub-pixel minimum repeating units 211 in the display panel 20, and can be aligned in one-to-one correspondence with the first sub-pixel minimum repeating units 211 in the display panel 20. The offset mark opening 1200 in the first evaporation shadow mask is configured to form the first offset mark A1 and the second offset mark A2 in the display panel 20. That is, the arrangement of all sub-pixel minimum repeating unit openings 1100 arranged in an array in the first shift area 111 and the common area 113 is exactly the same as the arrangement of all first sub-pixel minimum repeating units 211 arranged in an array in the display panel 20, and the sub-pixel minimum repeating unit openings 1100 have exactly the same shape and size as the first sub-pixel minimum repeating units 211 aligned with the sub-pixel minimum repeating unit openings 1100; the position of the offset mark opening 1200 relative to the sub-pixel minimum repeating unit openings 1100 in the common area 113 in the first evaporation shadow mask 11 is the same as the position of the first offset mark A1 relative to the first sub-pixel minimum repeating units 211 in the display area 21. Moreover, the sub-pixel minimum repeating unit openings 1100 of the common area 113 and the second shift area 112 of the first evaporation shadow mask 11 also have exactly the same as shape, size and number as the first sub-pixel minimum repeating units 211 in the display panel 20, and can be aligned in one-to-one correspondence with the first sub-pixel minimum repeating units 211 in the display panel 20.

Referring to FIGS. 2, 4, and 6, the packaged evaporation shadow mask may further include a second evaporation shadow mask 12, and the second evaporation shadow mask 12 also includes a first evaporation area 110 and a second evaporation area 120 at a periphery of the first evaporation area 110. The first evaporation area 110 includes a common area 113, a first shift area 111, and a second shift area 112, and the first shift area 111 and the second shift area 112 are respectively located on two sides of the common area 113; the common area 113, the first shift area 111, and the second shift area 112 are all provided with multiple sub-pixel minimum repeating unit openings 1100 with exactly the same shape and size; a sub-pixel minimum repeating unit opening pattern formed by the sub-pixel minimum repeating unit openings 1100 of the first shift area 111 and the common area 113 is the same as a sub-pixel minimum repeating unit opening pattern formed by the sub-pixel minimum repeating unit openings 1100 of the common area 113 and the second shift area 112. The second evaporation area 120 includes an offset mark opening 1200.

The sub-pixel minimum repeating unit openings 1100 of the first shift area 111 and the common area 113 of the second evaporation shadow mask 12 have exactly the same shape, size, and number as the second sub-pixel minimum repeating units 212 in the display panel 20, and can be aligned in one-to-one correspondence with the second sub-pixel minimum repeating units 212 in the display panel 20. The offset mark opening 1200 in the second evaporation shadow mask 12 is configured to form the first offset mark B1 and the second offset mark B2 in the display panel. That is, the arrangement of all sub-pixel minimum repeating unit openings 1100 arranged in an array in the first shift area 111 and the common area 113 is exactly the same as the arrangement of all second sub-pixel minimum repeating units 212 arranged in an array in the display panel 20, and the sub-pixel minimum repeating unit openings 1100 have exactly the same shape and size as the second sub-pixel minimum repeating units 212 aligned with the sub-pixel minimum repeating unit openings 1100; the position of the offset mark opening 1200 relative to the sub-pixel minimum repeating unit openings 1100 in the common area 113 in the second evaporation shadow mask 12 is the same as the position of the first offset mark B1 relative to the second sub-pixel minimum repeating units 212 in the display area 21 in the display panel 20. Moreover, the minimum repeating unit openings 1100 of the second shift area 112 and the common area 113 of the second evaporation shadow mask 12 also have exactly the same shape and size as the second sub-pixel minimum repeating units 212 in the display panel 20 and can be aligned in one-to-one correspondence with the second sub-pixel minimum repeating units 212 in the display panel 20.

Referring to FIGS. 2, 5, and 6, the packaged evaporation shadow mask may further include a third evaporation shadow mask 13, and the third evaporation shadow mask 13 also includes a first evaporation area 110 and a second evaporation area 120 at a periphery of the first evaporation area 110. The first evaporation area 110 includes a common area 113, a first shift area 111, and a second shift area 112, and the first shift area 111 and the second shift area 112 are respectively located on two sides of the common area 113; the common area 113, the first shift area 111, and the second shift area 112 are all provided with multiple sub-pixel minimum repeating unit openings 1100 with exactly the same shape and size; a sub-pixel minimum repeating unit opening pattern formed by the sub-pixel minimum repeating unit openings 1100 of the first shift area 111 and the common area 113 is the same as a sub-pixel minimum repeating unit opening pattern formed by the sub-pixel minimum repeating unit openings 1100 of the common area 113 and the second shift area 112. The second evaporation area 120 includes an offset mark opening 1200.

The sub-pixel minimum repeating unit openings 1100 of the first shift area 111 and the common area 113 of the third evaporation shadow mask 13 have exactly the same shape, size, and number as the third sub-pixel minimum repeating units 213 in the display panel 20, and can be aligned in one-to-one correspondence with the third sub-pixel minimum repeating units 213 in the display panel 20. The offset mark opening 1200 in the third evaporation shadow mask 13 is configured to form the first offset mark C1 and the second offset mark C2 in the display panel 20. That is, the arrangement of all sub-pixel minimum repeating unit openings 1100 arranged in an array in the first shift area 111 and the common area 113 is exactly the same as the arrangement of all third sub-pixel minimum repeating units 213 arranged in an array in the display panel 20, and the sub-pixel minimum repeating unit openings 1100 have exactly the same shape and size as the third sub-pixel minimum repeating units 213 aligned with the sub-pixel minimum repeating unit openings 1100; the position of the offset mark opening 1200 relative to the sub-pixel minimum repeating unit openings 1100 in the common area 113 in the third evaporation shadow mask 13 is the same as the position of the first offset mark C1 relative to the third sub-pixel minimum repeating units 213 in the display area 21. Moreover, the sub-pixel minimum repeating unit openings 1100 of the second shift area 112 and the common area 113 of the third evaporation shadow mask 11 also have exactly the same shape and size as the third sub-pixel minimum repeating units 213 in the display panel 20 and can be aligned in one-to-one correspondence with the third sub-pixel minimum repeating units 213 in the display panel 20.

It is to be understood that, generally speaking, a display panel usually includes sub-pixels of three colors of red, green, and blue, the sub-pixels of the three colors are arranged periodically, and each sub-pixel may be understood as one sub-pixel minimum repeating unit. Therefore, for ease of understanding, in embodiments shown in FIGS. 2 to 6, by way of example, the display panel includes a first sub-pixel minimum repeating unit 211, a second sub-pixel minimum repeating unit 212, and a third sub-pixel minimum repeating unit 213, and each of the first sub-pixel minimum repeating unit 211 and the second sub-pixel minimum repeating unit 212 includes only one sub-pixel, where the first sub-pixel minimum repeating unit 211 includes one first sub-pixel 2110, and the second sub-pixel minimum repeating unit 212 includes one second sub-pixel 2120. It is to be noted that, in this embodiment, the case where the display panel further includes the third sub-pixel minimum repeating unit 213 is used as an example. In other embodiments of the present disclosure, the display panel may include the third sub-pixel minimum repeating unit 213. In other words, the display panel may be provided with a first offset mark C1 and a second offset mark C2, and the packaged evaporation shadow mask may be provided with a third evaporation shadow mask 13. Further, the number of sub-pixels in each of the first sub-pixel minimum repeating unit 211, the second sub-pixel minimum repeating unit 212, and the third sub-pixel minimum repeating unit 213 is not limited to one. In the sub-pixel arrangement designs of other display panels, multiple sub-pixels may be provided in each sub-pixel minimum repeating unit.

Figure 7:
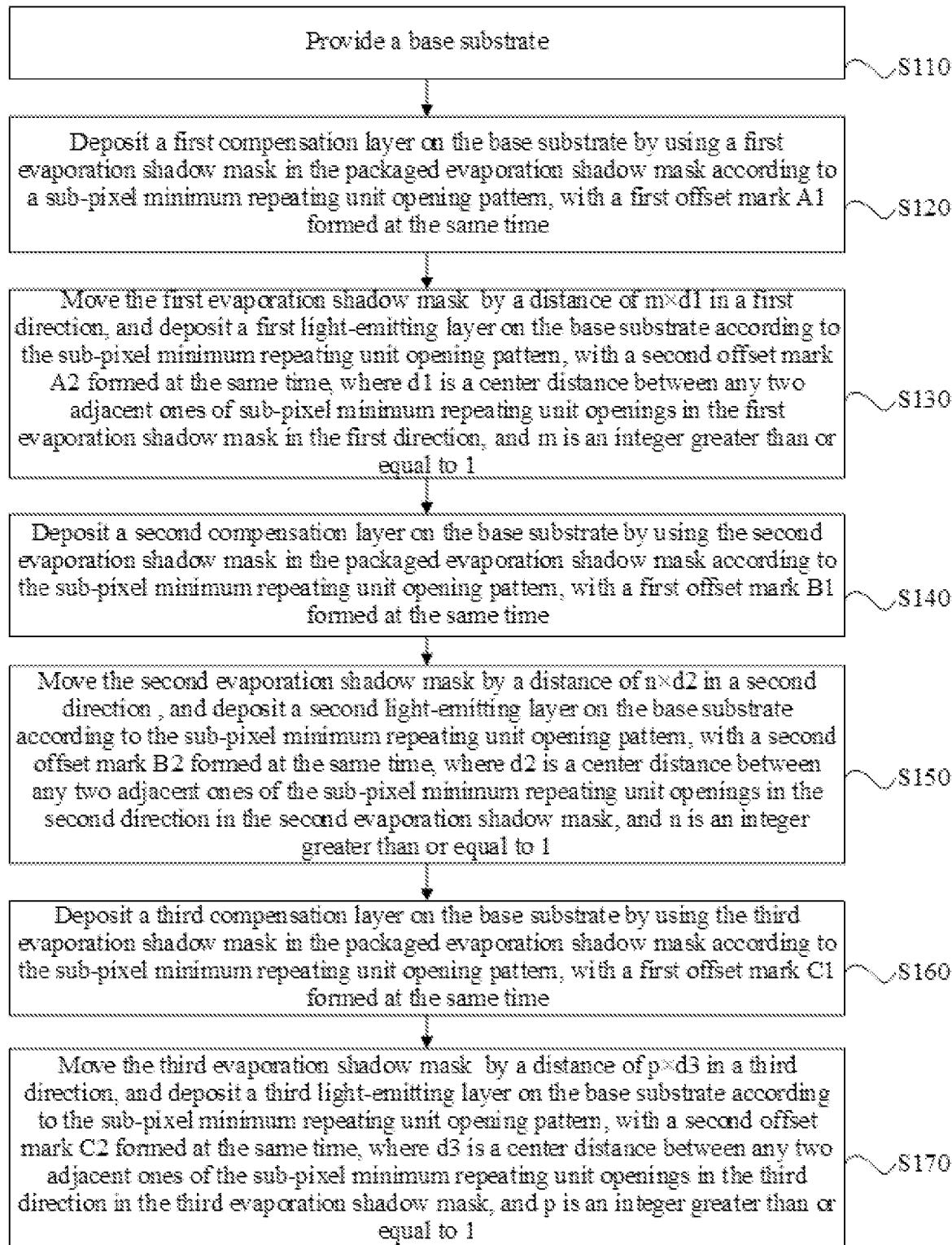
FIG. 7 is a flowchart of a preparation method of a display panel according to an embodiment of the present disclosure.
Figure 8:
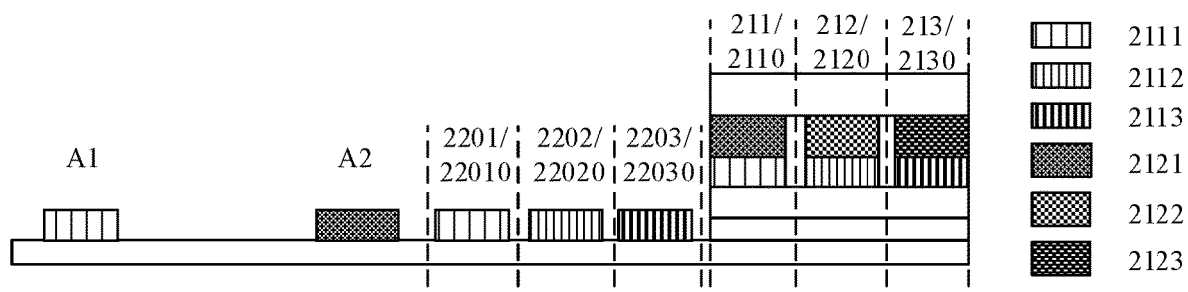
FIG. 8 is a sectional view taken along AA' of the display panel shown in FIG. 2.
Figure 9:
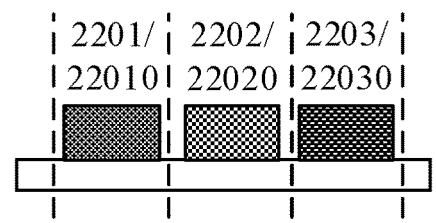
FIG. 9 is a sectional view taken along BB' of the display panel shown in FIG. 2.

Based on the packaged evaporation shadow mask provided in the preceding embodiment, embodiments of the present disclosure further provide a preparation method of a display panel for preparing any display panel provided in the preceding embodiment. Hereinafter, taking as an example the case where the display panel includes a first sub-pixel minimum repeating unit 211, a second sub-pixel minimum repeating unit 212, and a third sub-pixel minimum repeating unit 213 and the packaged evaporation shadow mask includes a first evaporation shadow mask 11, a second evaporation shadow mask 12 and a third evaporation shadow mask 13, the preparation method of the display panel will be described in detail. FIG. 7 is a flowchart of a preparation method of a display panel according to an embodiment of the present disclosure, FIG. 8 is a sectional view taken along AA' of the display panel shown in FIG. 2, FIG. 9 is a sectional view taken along BB' of the display panel shown in FIG. 2, and FIGS. 10 to 15 are sectional views of various steps in the preparation method of the display panel shown in FIG. 7. First, referring to FIGS. 2 to 11, the preparation method of the display panel includes the steps described below.

In S110, a base substrate is provided.

The base substrate is essentially a substrate forming a pixel drive circuit and part of film layers of an OLED sub-pixel. In this embodiment, the premise of preparing two offset marks by using the same evaporation shadow mask is that there are two film layers (e.g., a light-emitting layer and a compensation layer) with the same pattern in the OLED sub-pixel. Therefore, the base substrate mentioned in this embodiment is essentially a base substrate subjected to the processes before the processes for the light-emitting layer and the compensation layer.

In S120, a first compensation layer is deposited on the base substrate by using a first evaporation shadow mask in the packaged evaporation shadow mask according to a sub-pixel minimum repeating unit opening pattern, and a first offset mark A1 is formed at the same time.

Figure 10:
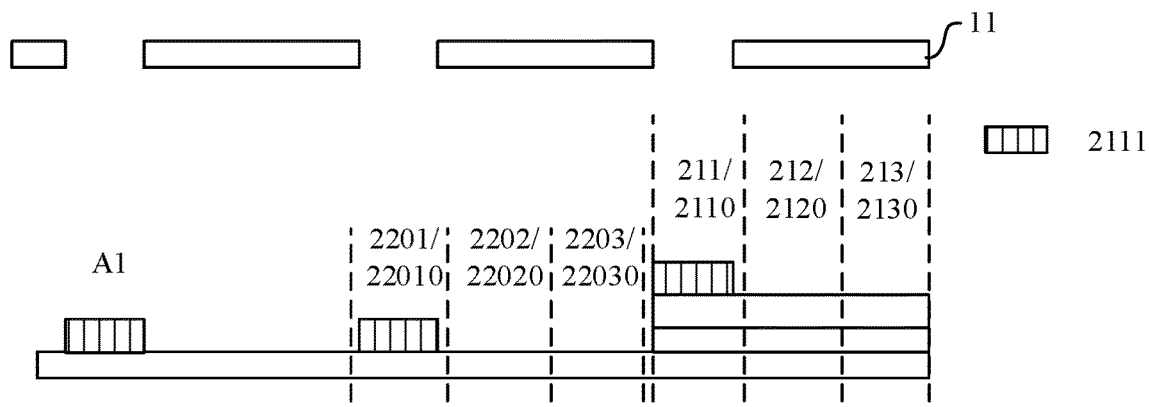
FIGS. 10 to 15 are structure diagrams showing various steps in the preparation method of the display panel shown in FIG. 7.

Referring to FIGS. 8 and 10, in this step, the first evaporation shadow mask 11 is configured to form a first compensation layer 2111 in the first sub-pixel minimum repeating unit 211 by evaporation. At the same time, since a second evaporation area 120 located at a periphery of the first evaporation shadow mask 11 is provided with an offset mark opening 1200, the first offset mark A1 is formed in a non-display area 22 of the display panel 20. Apparently, the material of the first offset mark A1 is the same as the material of the first compensation layer 2111.

In S130, the first evaporation shadow mask is moved by a distance of m×d1 in a first direction, a first light-emitting layer is deposited on the base substrate according to the sub-pixel minimum repeating unit opening pattern, and a second offset mark A2 is formed at the same time, where d1 is a center distance between any two adjacent sub-pixel minimum repeating unit openings in the first evaporation shadow mask in the first direction, and m is an integer greater than or equal to 1.

Figure 11:
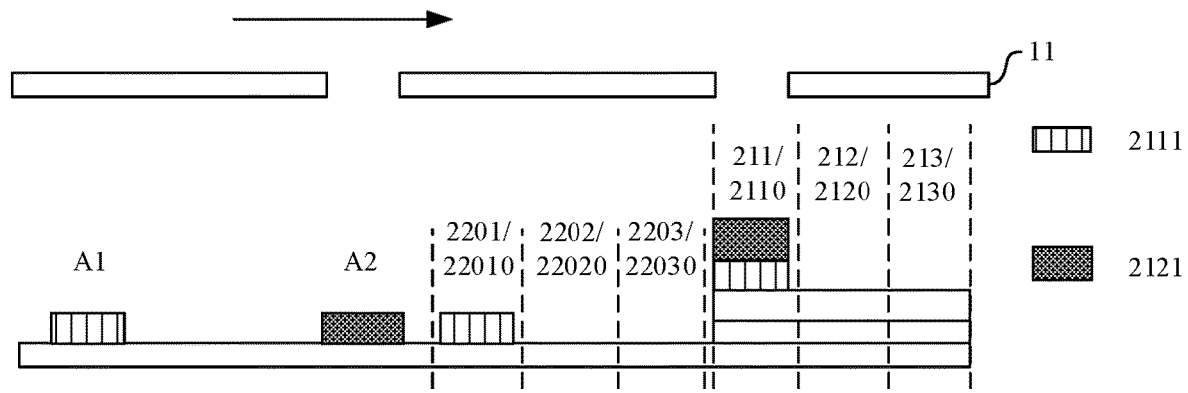

Referring to FIGS. 8 and 11, in this step, the first evaporation shadow mask 11 is configured to form a first light-emitting layer 2121 in the first sub-pixel minimum repeating unit 211 by evaporation. At the same time, since the second evaporation area 120 located at the periphery of the first evaporation shadow mask 11 is provided with the offset mark opening 1200, the second offset mark A2 is formed in the non-display area 22 of the display panel 20. Similarly, the material of the second offset mark A2 is the same as the material of the first light-emitting layer 2121.

As in the preceding steps S120 and S130, the compensation layer and the light-emitting layer of the first sub-pixel minimum repeating unit 211 are formed in the display panel 20 by using the first evaporation shadow mask 11, that is, the preparation of two key film layers in an OLED unit in the first sub-pixel minimum repeating unit 211 is completed.

With continued reference to FIGS. 2 to 13, the packaged evaporation shadow mask provided in embodiments of the present disclosure may be provided with a second evaporation shadow mask 12. For the specific structure of the second evaporation shadow mask 12, refer to FIG. 4, which will not be repeated herein. The preparation method of the display panel further includes the steps described below.

In S140, a second compensation layer is deposited on the base substrate by using the second evaporation shadow mask in the packaged evaporation shadow mask according to the sub-pixel minimum repeating unit opening pattern, and a first offset mark B1 is formed at the same time.

Figure 12:
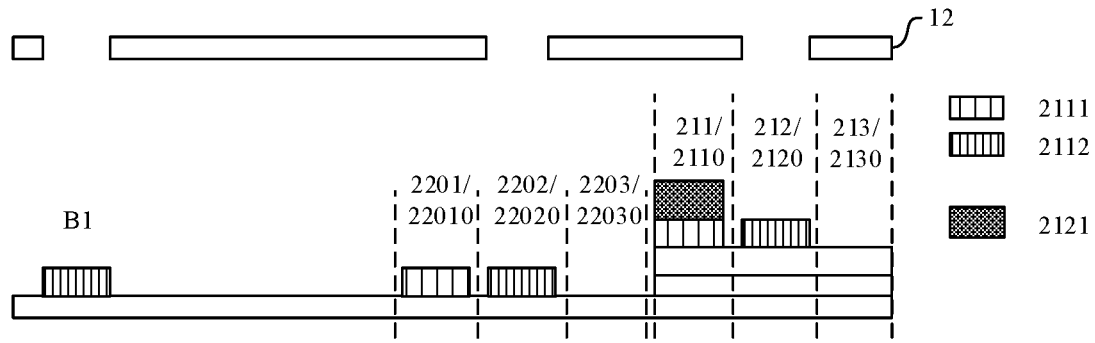

Referring to FIG. 12, similarly, in this step, the second evaporation shadow mask 12 is configured to form a second compensation layer 2112 in the second sub-pixel minimum repeating unit 212 by evaporation. At the same time, since the second evaporation area 120 located at a periphery of the second evaporation shadow mask 12 is provided with an offset mark opening 1200, the first offset mark B1 is formed in the non-display area 22 of the display panel 20. Apparently, the material of the first offset mark B1 is the same as the material of the second compensation layer 2112.

In S150, the second evaporation shadow mask is moved by a distance of n×d2 in a second direction, a second light-emitting layer is deposited on the base substrate according to the sub-pixel minimum repeating unit opening pattern, and a second offset mark B2 is formed at the same time, where d2 is a center distance between any two adjacent sub-pixel minimum repeating unit openings in the second evaporation shadow mask in the second direction, and n is an integer greater than or equal to 1.

Figure 13:
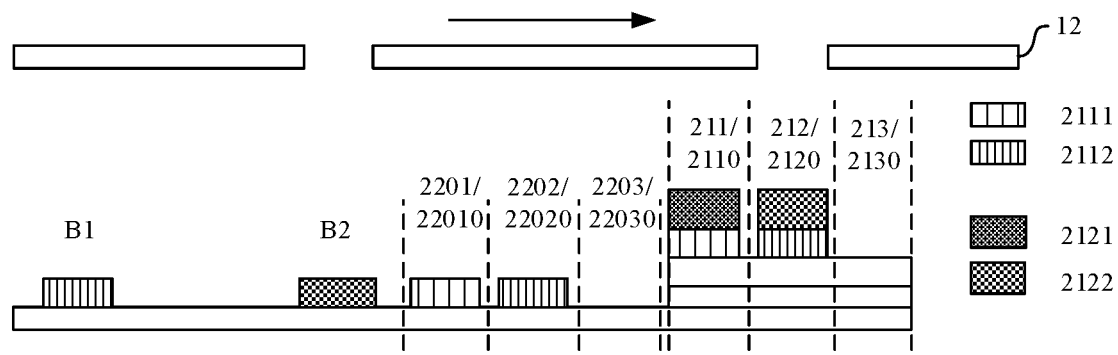

Referring to FIGS. 8 and 13, similarly, in this step, the second evaporation shadow mask 12 is configured to form a second light-emitting layer 2122 in the second sub-pixel minimum repeating unit 212 by evaporation. At the same time, since the second evaporation area 120 located at the periphery of the second evaporation shadow mask 12 is provided with the offset mark opening 1200, the second offset mark B2 is formed in the non-display area 22 of the display panel 20. Apparently, the material of the second offset mark B2 is the same as the material of the second light-emitting layer 2122.

As in the preceding steps S140 and S150, the compensation layer and the light-emitting layer of the second sub-pixel minimum repeating unit 212 are formed in the display panel 20 by using the second evaporation shadow mask 12, that is, the preparation of two key film layers in an OLED unit in the second sub-pixel minimum repeating unit 212 is completed.

With continued reference to FIGS. 2 to 15, the packaged evaporation shadow mask provided in embodiments of the present disclosure may be provided with a third evaporation shadow mask 13. For the specific structure of the third evaporation shadow mask 13, refer to FIG. 5, which will not be repeated herein. The preparation method of the display panel further includes the steps described below.

In S160, a third compensation layer is deposited on the base substrate by using the third evaporation shadow mask in the packaged evaporation shadow mask according to the sub-pixel minimum repeating unit opening pattern, and a first offset mark C1 is formed at the same time.

Figure 14:
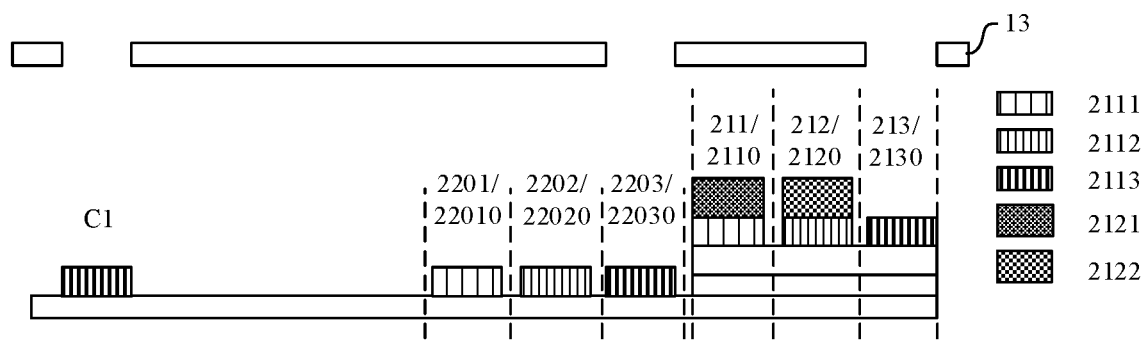

Referring to FIGS. 8 and 14, similarly, in this step, the third evaporation shadow mask 13 is configured to form a third compensation layer 2113 in the third sub-pixel minimum repeating unit 213 by evaporation. At the same time, since the second evaporation area 120 located at a periphery of the third evaporation shadow mask 13 is provided with an offset mark opening 1200, the first offset mark C1 is formed in the non-display area 22 of the display panel 20. Apparently, the material of the first offset mark C1 is the same as the material of the third compensation layer 2113.

In S170, the third evaporation shadow mask is moved by a distance of p×d3 in a third direction, a third light-emitting layer is deposited on the base substrate according to the sub-pixel minimum repeating unit opening pattern, and a second offset mark C2 is formed at the same time, where d3 is a center distance between any two adjacent sub-pixel minimum repeating unit openings in the third evaporation shadow mask in the third direction, and p is an integer greater than or equal to 1.

Figure 15:
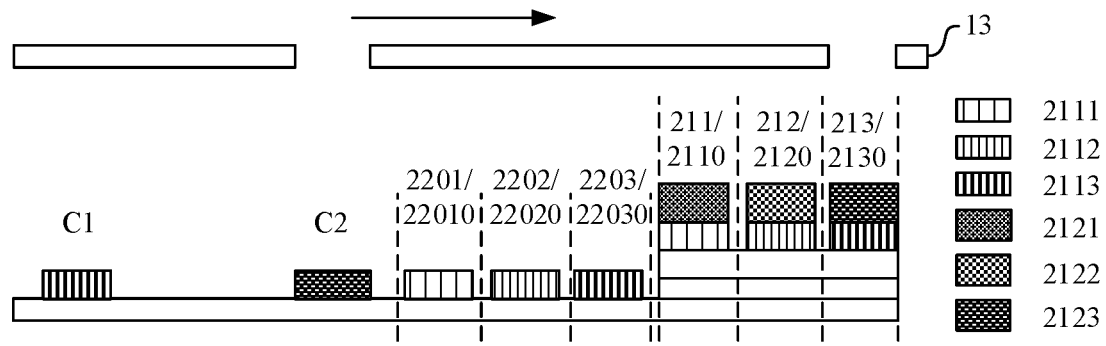

Referring to FIGS. 8 and 15, similarly, in this step, the third evaporation shadow mask 13 is configured to form a third light-emitting layer 2123 in the third sub-pixel minimum repeating unit 213 by evaporation. At the same time, since the second evaporation area 120 located at the periphery of the third evaporation shadow mask 13 is provided with the offset mark opening 1200, the second offset mark C2 is formed in the non-display area 22 of the display panel 20. Apparently, the material of the second offset mark C2 is the same as the material of the third light-emitting layer 2123.

As in the preceding steps S160 and S170, the compensation layer and the light-emitting layer of the third sub-pixel minimum repeating unit 213 are formed in the display panel 20 by using the third evaporation shadow mask 13, that is, the preparation of two key film layers in an OLED unit in the third sub-pixel minimum repeating unit 213 is completed.

It is to be noted that FIGS. 8, 10, and 11 are actually part of the sectional views in a row where the first offset mark A1 is located, FIGS. 12 and 13 are actually part of the sectional views in a row where the first offset mark B1 is located, and FIGS. 14 and 15 are actually part of the sectional views in a row where the first offset mark C1 is located. Comparing FIGS. 10 to 15, it can be seen that a first virtual sub-pixel minimum repeating unit 2201, a second virtual sub-pixel minimum repeating unit 2202, a third virtual sub-pixel minimum repeating unit 2203, the first sub-pixel minimum repeating unit 211, the second sub-pixel minimum repeating unit 212, and the third sub-pixel minimum repeating unit 213 at section lines of different rows may all be formed sequentially by evaporation, and the formed film structures are also the same. In other words, as shown in FIGS. 10 to 15, a detailed process of sequentially stacking the film layers of the virtual sub-pixel minimum repeating unit and the sub-pixel minimum repeating unit can be obtained. The difference is that the offset marks displayed in the non-display area are different due to the different positions of the section lines in FIGS. 10 to 15. That is, FIGS. 10 and 11 may show the evaporation formation process of the first offset mark A1 and the second offset mark A2, FIGS. 12 and 13 may show the evaporation formation process of the first offset mark B1 and the second offset mark B2, and FIGS. 14 and 15 may show the evaporation formation process of the first offset mark C1 and the second offset mark C2.

In the packaged evaporation shadow mask, the display panel, and the preparation method of the display panel provided in embodiments of the present disclosure, the packaged evaporation shadow mask includes an evaporation shadow mask, and offset marks are respectively formed in different evaporation processes by using an offset mark opening on the evaporation shadow mask, so that the offsets of film layers formed in the different evaporation processes can be respectively monitored by detecting offsets of the offset marks. In this embodiment, the problems such as complexity and relatively high cost of an existing offset detection process can be solved. Through the shift of the evaporation shadow mask, the accurate and effective measurement of an evaporation offset can be achieved, half of fine metal masks can be saved, and the measurement cost of the evaporation offset can be greatly reduced.

It is also to be noted that, since in the preceding preparation method, the case where the display panel includes the third sub-pixel minimum repeating unit is used as an example, the first offset mark C1 and the second offset mark C2 are correspondingly arranged in the display panel, and the packaged evaporation shadow mask includes the third evaporation shadow mask 13. Based on this, the steps of the preparation method include step S160 and step S170. For the display panel that does not include the third sub-pixel minimum repeating unit, the first offset mark C1 and the second offset mark C2 are not provided, and the packaged evaporation shadow mask does not include the third evaporation shadow mask 13. Therefore, the corresponding preparation method does not include step S160 and step S170.

To facilitate understanding and interpretation, in the preceding embodiment, the case where the first direction, the second direction, and the third direction are row directions is used as an example. Those skilled in the art may understand that the first direction, the second direction, and the third direction are respectively the shift direction of the first sub-pixel minimum repeating unit, the shift direction of the second sub-pixel minimum repeating unit, and the shift direction of the third sub-pixel minimum repeating unit in two evaporation processes. The actual shift direction of the sub-pixel minimum repeating unit depends on a periodic arrangement direction of the sub-pixel minimum repeating unit. As shown in FIG. 2, multiple sub-pixels or sub-pixel minimum repeating units of the same color are arranged periodically in the row direction, and the shift direction is the row direction. However, in the art, the arrangement of sub-pixels is not limited to a strict array arrangement. Therefore, the periodic arrangement direction of the sub-pixel minimum repeating units may also be a column direction or another direction that forms an arbitrary angle with the row direction. In an exemplarily embodiment, each of the first direction, the second direction, and the third direction may be the row direction, the column direction, or a direction that forms an angle of 45 degrees with the row direction.

First, with continued reference to FIGS. 3 to 5, in embodiments of the present disclosure, in the case where the first direction, the second direction, and the third direction are the row direction or the column direction, two offset marks are formed respectively in two evaporation processes by using the same evaporation shadow mask, and the evaporation shadow mask needs to be shifted in the two evaporation processes. Therefore, the first evaporation area of the evaporation shadow mask is essentially additionally provided with multiple sub-pixel minimum repeating unit openings so that even after the shift, in the evaporation shadow mask, there still exists sub-pixel minimum repeating unit openings which are completely aligned with the sub-pixel minimum repeating units to be formed in the display panel. It is to be understood that since the evaporation shadow mask is additionally provided with the multiple sub-pixel minimum repeating unit openings, the additional sub-pixel minimum repeating unit openings also form an evaporation pattern in the non-display area of the display panel in the evaporation process. Based on this, first, referring to FIG. 2, in the display panel of this embodiment, the non-display area 22 includes a first non-display area 221 and a second non-display area 222, and the first non-display area 221 and the second non-display area 222 are located on two opposite sides of the display panel 21 in the first direction 1; each of the first non-display area 221 and the second non-display area 222 includes one group of first virtual sub-pixel minimum repeating units 2201, and each of the first virtual sub-pixel minimum repeating units 2201 includes at least one first virtual sub-pixel 22010; the one group of first virtual sub-pixel minimum repeating units 2201 are arranged sequentially in a direction perpendicular to the first direction 1, and the shape, size, and arrangement of the at least one first virtual sub-pixel 22010 in each of the first virtual sub-pixel minimum repeating units 2201 are exactly the same as the shape, size, and arrangement of the at least one first sub-pixel 2110 in a respective one of the first sub-pixel minimum repeating units 211.

With continued reference to FIG. 2, in the display panel, the non-display area 22 may further includes a third non-display area 223 and a fourth non-display area 224, and the third non-display area 223 and the fourth non-display area 224 are located on two opposite sides of the display panel 21 in the second direction 2; each of the third non-display area 223 and the fourth non-display area 224 includes one group of second virtual sub-pixel minimum repeating units 2202, and each of the second virtual sub-pixel minimum repeating units 2202 includes at least one second virtual sub-pixel 22020; the one group of second virtual sub-pixel minimum repeating units 2202 are arranged sequentially in a direction perpendicular to the second direction 2, and the shape, size, and arrangement of the at least one second virtual sub-pixel 22020 in each of the second virtual sub-pixel minimum repeating units 2202 are exactly the same as the shape, size, and arrangement of the at least one second sub-pixel 2120 in a respective one of the second sub-pixel minimum repeating unit 212.

With continued reference to FIG. 2, in the display panel, the non-display area 22 may further include a fifth non-display area 225 and a sixth non-display area 226, and the fifth non-display area 225 and the sixth non-display area 226 are located on two opposite sides of the display panel 21 in the third direction 3; each of the fifth non-display area 225 and the sixth non-display area 226 includes one group of third virtual sub-pixel minimum repeating units 2203, and the one group of third virtual sub-pixel minimum repeating units 2203 are arranged sequentially in a direction perpendicular to the third direction 3, and the shape, size, and arrangement interval of the third virtual sub-pixel minimum repeating units 2203 are exactly the same as the shape, size, and arrangement interval of the third sub-pixel minimum repeating units 213.

It is to be understood that the additional sub-pixel minimum repeating unit openings in the evaporation shadow mask form the virtual sub-pixel minimum repeating units in the non-display area in the first evaporation process. In the second evaporation process, after the shift, each of the additional sub-pixel minimum repeating unit openings needs to be aligned with one sub-pixel minimum repeating unit in the display area. By way of example, referring to FIG. 2, a sub-pixel minimum repeating unit opening in the evaporation shadow mask corresponding to the first virtual sub-pixel minimum repeating unit 2201 in the first evaporation process, after being shifted in the first direction 1, is aligned with one first sub-pixel minimum repeating unit 211 in the display area in the second evaporation process. It is to be noted that a sub-pixel minimum repeating unit opening in the evaporation shadow mask corresponding to the first sub-pixel minimum repeating unit 211 in the first evaporation process will be shifted by the same distance in the second evaporation process and corresponds to one first sub-pixel minimum repeating unit 211 in the display area in the second evaporation process. Based on this, referring to FIG. 2, in this embodiment, in the first direction 1, a center distance between the first virtual sub-pixel minimum repeating unit 2201 and the first sub-pixel minimum repeating unit 211 that are adjacent to each other is equal to a center distance between two adjacent first sub-pixel minimum repeating units 211; in the second direction 2, a center distance between the second virtual sub-pixel minimum repeating unit 2202 and the second sub-pixel minimum repeating unit 212 that are adjacent to each other is equal to a center distance between two adjacent second sub-pixel minimum repeating units 212. Similarly, in the third direction 3, a center distance between the third virtual sub-pixel minimum repeating unit 2203 and the third sub-pixel minimum repeating unit 213 that are adjacent to each other is equal to a center distance between two adjacent third sub-pixel minimum repeating units 213.

With continued reference to FIGS. 8 and 9, in the display panel, the first sub-pixel minimum repeating unit 211 includes a first compensation layer 2111 and a first light-emitting layer 2121 that are stacked.

The first virtual sub-pixel 22010 in the first virtual sub-pixel minimum repeating unit 2201 located in the first non-display area 221 includes the first compensation layer 2111 and does not include the first light-emitting layer 2121; the first virtual sub-pixel 22010 in the first virtual sub-pixel minimum repeating unit 2201 located in the second non-display area 222 includes the first light-emitting layer 2121 and does not include the first compensation layer 2111.

With continued reference to FIGS. 8 and 9, in the display panel, the second sub-pixel minimum repeating unit 212 may include a second compensation layer 2112 and a second light-emitting layer 2122 that are stacked; the second virtual sub-pixel 22020 in the second virtual sub-pixel minimum repeating unit 2202 located in the third non-display area 223 includes the second compensation layer 2112 and does not include the second light-emitting layer 2122; the second virtual sub-pixel 22020 in the second virtual sub-pixel minimum repeating unit 2202 located in the fourth non-display area 224 includes the second light-emitting layer 2122 and does not include the second compensation layer 2112.

Further, with continued reference to FIGS. 8 and 9, in the display panel, the third sub-pixel minimum repeating unit 213 may include a third compensation layer 2113 and a third light-emitting layer 2123 that are stacked; a third virtual sub-pixel 22030 in the third virtual sub-pixel minimum repeating unit 2203 located in the fifth non-display area 225 includes the third compensation layer 2113 and does not include the third light-emitting layer 2123; the third virtual sub-pixel 22030 in the third virtual sub-pixel minimum repeating unit 2203 located in the sixth non-display area 226 includes the third light-emitting layer 2123 and does not include the third compensation layer 2113.

Specifically, from the perspective of steps of the preparation process, in embodiments of the present disclosure, the first offset mark A1, the compensation layers of the first virtual sub-pixels 22010 located in the first non-display area 221, and the compensation layers of the first sub-pixels 2110 in the display area 21, and the second offset mark A2, the light-emitting layers of the first virtual sub-pixels 22010 in the second non-display area 222 and the light-emitting layers of the first sub-pixel 2110 in the display area 21 are prepared in different evaporation processes by using the same evaporation shadow mask.

The first offset mark B1, the compensation layers of the second virtual sub-pixel 22020 located in the third non-display area 223 and the compensation layers of the second sub-pixels 2120 in the display area, and the second offset mark B2, the light-emitting layers of the second virtual sub-pixels 22020 in the fourth non-display area 224 and the light-emitting layers of the second sub-pixels 2120 in the display area 21 are prepared in different evaporation processes by using the same evaporation shadow mask.

Similarly, the first offset mark C1, the compensation layers of the third virtual sub-pixels 22030 located in the fifth non-display area 225 and the compensation layers of the third sub-pixel 2130 in the display area 21, and the second offset mark C2, the light-emitting layers of the third virtual sub-pixels 22030 in the sixth non-display area 226 and the light-emitting layers of the third sub-pixel 2130 of the display area 21 are prepared in different evaporation processes by using the same evaporation shadow mask.

It is to be understood that, in embodiments of the present disclosure, since the first offset mark A1 and the second offset mark A2 are prepared in different evaporation processes by using the same first evaporation shadow mask 11, the shape and size of the first offset mark A1 are exactly the same as the shape and size of the second offset mark A2. Similarly, the shape and size of the first offset mark B1 are exactly the same as the shape and size of the second offset mark B2, and the shape and size of the first offset mark C1 are exactly the same as the shape and size of the second offset mark C2.

Figure 16:
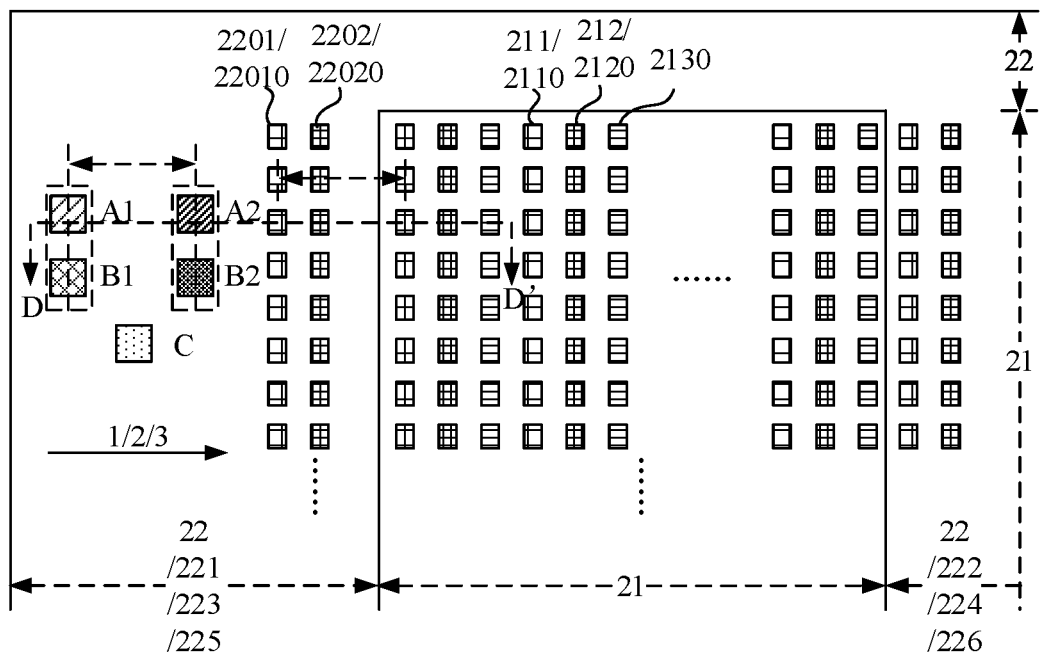
FIG. 16 is a structure diagram of another display panel according to an embodiment of the present disclosure.
Figure 17:
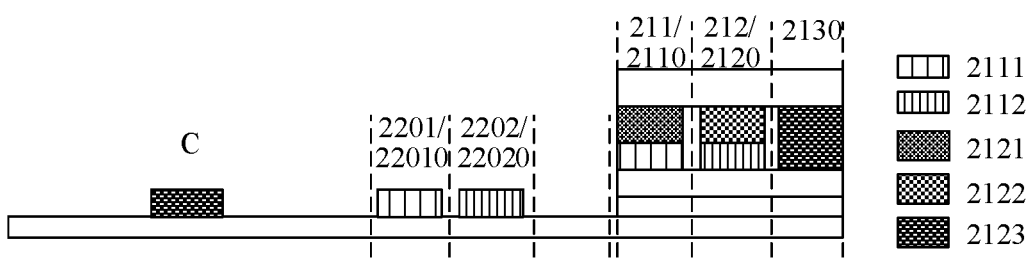
FIG. 17 is a sectional view taken along DD' of the display panel shown in FIG. 16.

For a display panel that only includes the first sub-pixel minimum repeating unit and the second sub-pixel minimum repeating unit and does not include the third sub-pixel minimum repeating unit, embodiments of the present disclosure also provide specific embodiments. FIG. 16 is a structure diagram of another display panel according to an embodiment of the present disclosure, and FIG. 17 is a sectional view taken along DD' of the display panel shown in FIG. 16. Referring to FIGS. 16 and 17, in addition to the first sub-pixel minimum repeating unit 211 and the second sub-pixel minimum repeating unit 212, the display area 21 further includes multiple third sub-pixels 2130, and a color of the first sub-pixel 2110, a color of the second sub-pixel 2120, and a color of the third sub-pixel 2130 are different; the third sub-pixel 2130 includes a third light-emitting layer 2123 and does not include a compensation layer; the non-display area 22 further includes a third offset mark C; the third offset mark C and the third light-emitting layer 2123 of the third sub-pixel 2130 are prepared in the same evaporation process by using the same evaporation shadow mask.

In this embodiment, the first sub-pixel 2110, the second sub-pixel 2120, and the third sub-pixel 2130 that are adjacent to each other in the display panel form one pixel unit, and the third sub-pixel 2130 includes the third light-emitting layer 2123 and is not provided with the compensation layer. Therefore, when the third sub-pixel 2130 is prepared, only one light-shielding shadow mask is needed for the evaporation of the third light-emitting layer 2123, and the evaporation shadow mask may be provided with an offset mark opening at a periphery of the first evaporation area, that is, the second evaporation area. The offset mark opening is used for evaporation to form the third offset mark C, and thus the offset of the third light-emitting layer 2123 can be detected.

Figure 18:
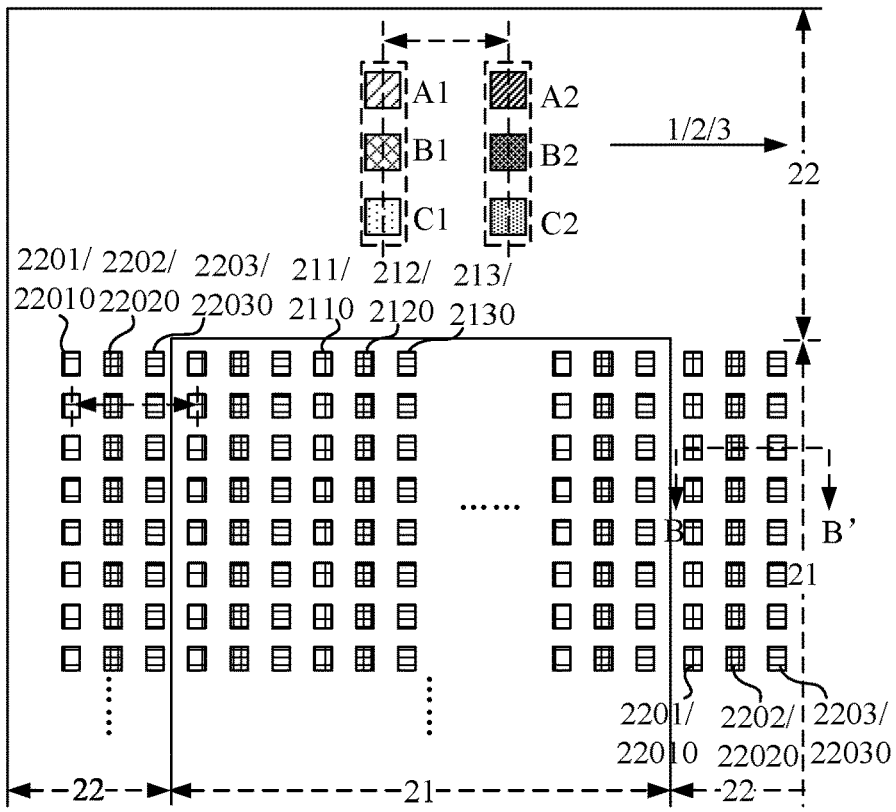
FIG. 18 is a partial structure diagram of another display panel according to an embodiment of the present disclosure.

Based on the preceding embodiments, the present disclosure does not limit the position of each offset mark, and there are multiple implementations, which will be described in detail below. Similarly, the case where the display panel includes the first offset mark A1 and the second offset mark A2, the first offset mark B1 and the second offset mark B2, and the first offset mark C1 and the second offset mark C2 is used as an example. First, as shown in the preceding embodiment, the first offset mark A1 and the second offset mark A2, the first offset mark B1 and the second offset mark B2, and the first offset mark C1 and the second offset mark C2 are all disposed on the same side parallel to the row direction, that is, on the left side of the display area of the display panel. The first direction 1, the second direction 2, and the third direction 3 are all row directions. It is to be noted that the row direction and the column direction involved in embodiments of the present disclosure are based on the sub-pixel minimum repeating units of the display panel forming an array arrangement in multiple rows and columns or the sub-pixel minimum repeating unit openings in the evaporation shadow mask forming an array arrangement in multiple rows and columns. FIG. 18 is a partial structure diagram of another display panel according to an embodiment of the present disclosure.

Referring to FIG. 18, the case where the first direction 1, the second direction 2, and the third direction 3 are all row directions is used as an example, and the first offset mark A1 and the second offset mark A2, the first offset mark B1 and the second offset mark B2, and the first offset mark C1 and the second offset mark C2 are all disposed on the same side of the display area 21 in a direction perpendicular to the row direction, such as the side above the display area 21 of the display panel.

Further, for the positions of the offset marks prepared by using different evaporation shadow masks, embodiments of the present disclosure also provide multiple implementations. For example, at least two of the first offset mark A1, the first offset mark B1 or the first offset mark C1 may be located on different sides of the display area.

Figure 19:
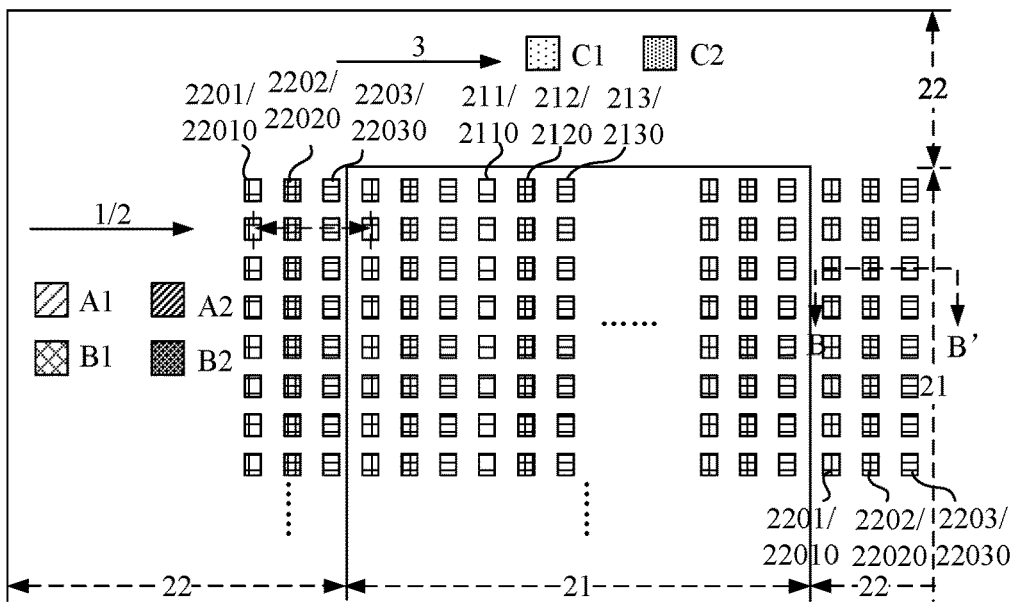
FIG. 19 is a partial structure diagram of another display panel according to an embodiment of the present disclosure.

FIG. 19 is a partial structure diagram of another display panel according to an embodiment of the present disclosure. Referring to FIG. 19, specifically, the case where the first direction 1, the second direction 2, and the third direction 3 are all row directions is used as an example, at least one pair of offset marks among the first offset mark A1 and the second offset mark A2, the first offset mark B1 and the second offset mark B2, and the first offset mark C1 and the second offset mark C2 are located on the same side of the display area 21 in a direction parallel to the row direction, such as the left side of the display area 21 of the display panel, and at least one pair of offset marks are located on the same side of the display area 21 in the direction perpendicular to the row direction, such as the side above the display area 21 of the display panel.

The first direction 1, the second direction 2, and the third direction 3 each essentially indicate a direction in which the evaporation shadow mask needs to be shifted in two evaporation processes, and two formed offset marks are also arranged in the shift direction. Therefore, in the case where the first direction 1, the second direction 2, and the third direction 3 are configured to be row directions, it indicates that the first offset mark A1 and the second offset mark A2, the first offset mark B1 and the second offset mark B2, and the first offset mark C1 and the second offset mark C2 are all arranged in the row direction.

Figure 20:
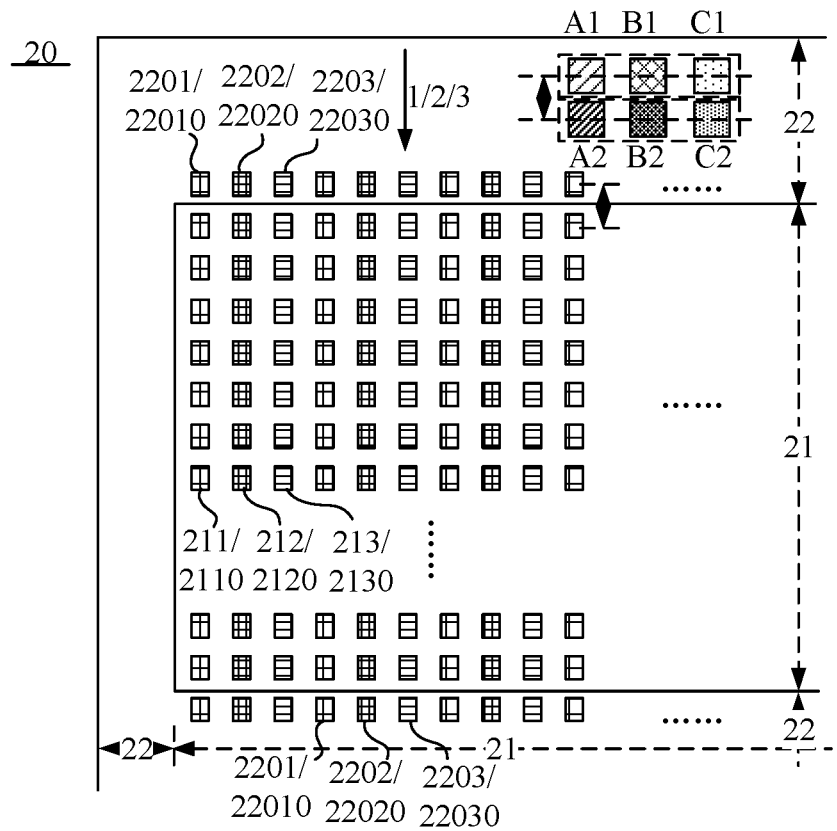
FIGS. 20 to 22 are partial structure diagrams of another display panels according to an embodiment of the present disclosure.
Figure 21:
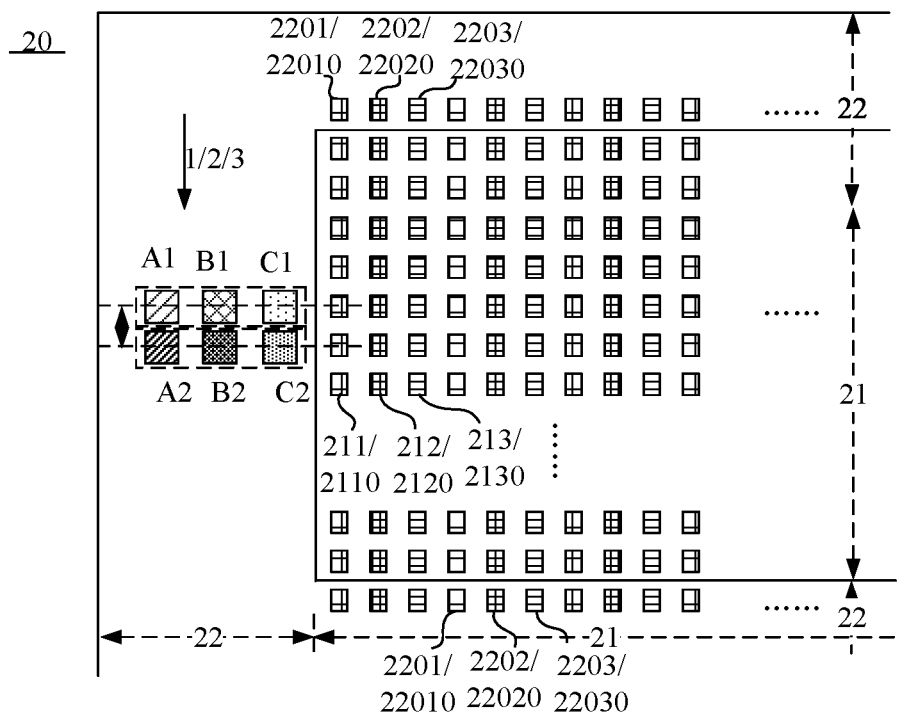
Figure 22:
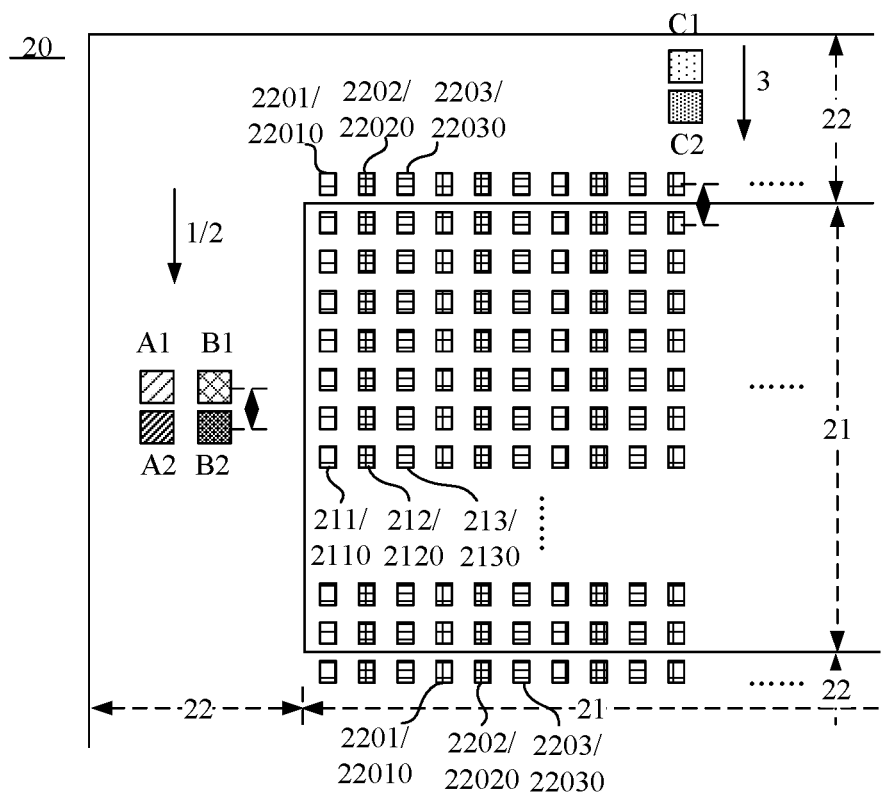

FIGS. 20 to 22 are partial structure diagrams of another display panels according to an embodiment of the present disclosure. First, referring to FIG. 20, the case where the first direction 1, the second direction 2, and the third direction 3 are all column directions is used as an example, and the first offset mark A1 and the second offset mark A2, the first offset mark B1 and the second offset mark B2, and the first offset mark C1 and the second offset mark C2 may all be disposed on the same side of the display area 21 in a direction parallel to the column direction, such as the side above the display area 21 of the display panel. Referring to FIG. 21, similarly, the case where the first direction 1, the second direction 2, and the third direction 3 are all column directions is used as an example, and the first offset mark A1 and the second offset mark A2, the first offset mark B1 and the second offset mark B2, and the first offset mark C1 and the second offset mark C2 may all be disposed on the same side of the display area 21 a direction perpendicular to the column direction, such as the left side of the display area 21 of the display panel. Referring to FIG. 22, similarly, the case where the first direction 1, the second direction 2, and the third direction 3 are all column directions is used as an example, and at least one pair of offset marks among the first offset mark A1 and the second offset mark A2, the first offset mark B1 and the second offset mark B2, and the first offset mark C1 and the second offset mark C2 are located on the same side of the display area 21 in a direction parallel to the column direction, such as the left side of the display area 21 of the display panel, and at least one pair of offset marks are located on the same side of the display area 21 in the direction perpendicular to the column direction, such as the side above the display area 21 of the display panel.

In the case where the first direction 1, the second direction 2, and the third direction 3 are configured to be column directions, it indicates that the first offset mark A1 and the second offset mark A2, the first offset mark B1 and the second offset mark B2, and the first offset mark C1 and the second offset mark C2 are all arranged in the column direction.

Correspondingly, for the design of the opening pattern of the evaporation shadow mask, it is necessary to consider the problems of the shift directions of two evaporation processes and the position of the offset mark opening. It is to be understood that, based on the preceding display panel, in embodiments of the present disclosure, the offset mark opening 1200 in the first evaporation shadow mask 11, the offset mark opening 1200 in the second evaporation shadow mask 12, and the offset mark opening 1200 in the third evaporation shadow mask 13 may be configured to be located on one side of the first evaporation area 110 perpendicular to or parallel to a fourth direction 4, and the fourth direction 4 is the row direction or column direction of the evaporation shadow mask, or a direction that forms an angle of 45 degrees with the row direction. Taking as an example the case where the fourth direction is the row direction, the offset mark opening 1200 in the first evaporation shadow mask 11, the offset mark opening 1200 in the second evaporation shadow mask 12, and the offset mark opening 1200 in the third evaporation shadow mask 13 may all be disposed on the same side of the first evaporation area 110 in a direction parallel to the fourth direction, such as the left side, or on the same side of the first evaporation area 110 in a direction perpendicular to the fourth direction, such as the upper side; further, the offset mark opening 1200 in the first evaporation shadow mask 11, the offset mark opening 1200 in the second evaporation shadow mask 12, and the offset mark opening 1200 in the third evaporation shadow mask 13 may be not disposed on the same side, for example, the offset mark opening 1200 in the first evaporation shadow mask 11 and the offset mark opening 1200 in the second evaporation shadow mask 12 are located on the left side, and the offset mark opening 1200 in the third evaporation shadow mask 13 is located on the upper side. It is to be understood that the positions of the offset mark openings in the three evaporation shadow masks may be variously designed, and those skilled in the art can make selections according to actual needs, which is not excessively limited herein.

It is to be noted that the first direction, the second direction, and the third direction of the display panel and the packaged mask as shown in the preceding embodiment are parallel and indicate the row directions or the column directions, and in embodiments of the present disclosure, at least one direction may be the column direction, and at least one direction may be the row direction.

Specifically, in some of the preceding embodiments, the first direction, the second direction, and the third direction are parallel to each other, for example, all the directions are the row directions or the column directions. In this case, offset marks may be disposed on the same side of the display area 21 of the display panel, for example, the offset marks are disposed on the left side of the display area 21 as shown in FIG. 2. Apparently, in this case, the positions of the first offset mark A1 and the second offset mark A2, the first offset mark B1 and the second offset mark B2, and the first offset mark C1 and the second offset mark C2 are relatively close to each other. During the offset measurement, an image acquisition unit may collect the offset marks one by one or collect all the offset marks at one time so that the moving distance of the image acquisition unit during the offset measurement can be reduced and the efficiency of the offset measurement can be improved. Of course, those skilled in the art can also understand that the first direction, the second direction, and the third direction may be not parallel. For example, the first direction and the second direction are the row directions, and the third direction is the column direction. In this case, the first offset mark A1 and the second offset mark A2 may be disposed on the left side of the display area, the first offset mark B1 and the second offset mark B2 may be disposed on the right side of the display area 21, and the first offset mark C1 and the second offset mark C2 may be disposed on the upper side of the display area 21. The offset marks are distributed on different sides of the display area 21 of the display panel so that too wide non-display area due to the gathering of the offset marks can be avoided, which is conducive to achieving a narrow bezel of the display panel.

Further, it is to be noted that the positions of the first offset mark A1 and the second offset mark A2 on the display panel should be significantly misaligned so that mutual interference can be avoided, which facilitates the offset measurement. At the same time, other offset marks also need to be misaligned. Therefore, for the three evaporation shadow masks forming the three types of offset marks A, B, and C, the relative positions of the offset mark openings are actually misaligned. The relative position here refers to the position of the offset mark opening relative to the entire evaporation shadow mask where the offset mark opening is located or relative to the sub-pixel minimum repeating unit opening in the evaporation shadow mask where the offset mark opening is located. In the case where the three evaporation shadow masks are respectively aligned with the display panel, the offset marks formed through the offset mark openings are misaligned, and even if the evaporation shadow masks are shifted relative to the display panel, the formed offset marks do not overlap with each other so that the accurate measurement of the evaporation offset of each film layer can be ensured.

Therefore, based on the preceding embodiment in which the first direction, the second direction, and the third direction are all parallel to each other, the present disclosure further provides a specific implementation. With continued reference to FIGS. 2 and 16, the first direction 1 and the second direction 2 may be configured to be parallel; the first offset mark A1 and the first offset mark B1 are arranged sequentially perpendicular to the first direction 1; and the second offset mark A2 and the second offset mark B2 are arranged sequentially perpendicular to the first direction 1.

On this basis, with continued reference to FIGS. 3 to 5, in the packaged evaporation shadow mask provided in embodiments of the present disclosure, the offset mark opening 1200 in the first evaporation shadow mask 11, the offset mark opening 1200 in the second evaporation shadow mask 12, and the offset mark opening 1200 in the third evaporation shadow mask 13 are arranged sequentially perpendicular to the fourth direction 4.

As shown in FIG. 2, the case where the first direction is the row direction is used as an example. In this case, the first offset mark A1, the first offset mark B1, and the first offset mark C1 are arranged sequentially in the column direction, and the second offset mark A2, the second offset mark B2, and the second offset mark C2 are also arranged sequentially in the column direction. In this case, the center distances of the three pairs of first offset marks and second offset marks are all the same, and the six offset marks are actually arranged in an array.

The center distance between the first offset mark and the second offset mark depends on the center distance between the two corresponding adjacent sub-pixel minimum repeating units. The center distance between the first offset mark A1 and the second offset mark A2 should be an integral multiple of the center distance between two adjacent first sub-pixel minimum repeating units in the first direction, the center distance between the first offset mark B1 and the second offset mark B2 should be an integral multiple of the center distance between two adjacent second sub-pixel minimum repeating units in the second direction, and the center distance between the first offset mark C1 and the second offset mark C2 should be an integral multiple of the center distance between two adjacent third sub-pixel minimum repeating units in the third direction. In the display panel shown in FIG. 2, the center distances of three pairs of first offset marks and second offset marks are all the same, which is actually because the center distance between two adjacent first sub-pixel minimum repeating units in the first direction, the center distance between two adjacent second sub-pixel minimum repeating units in the second direction and the center distance between two adjacent third sub-pixel minimum repeating units in the third direction are all the same. It is to be noted here that as shown in FIG. 2, the center distance between the first offset mark and the second offset mark is equal to the center distance between two corresponding adjacent sub-pixel minimum repeating units in the first direction, which is only an implementation of the present disclosure and may be set by those skilled in the art according to actual needs. Further, as shown in FIG. 2, since the center distance between the first offset mark and the second offset mark is equal to the center distance between two corresponding adjacent sub-pixel minimum repeating units in the first direction, in the case where the first offset mark and the second offset mark are prepared in two evaporation processes by using the same evaporation shadow mask, the evaporation shadow mask only needs to be moved by the periodic distance of one sub-pixel minimum repeating unit. In this case, the non-display areas 22 on two opposite sides of the display area 21 each form one column of virtual sub-pixel minimum repeating units. As shown in FIG. 2, three evaporation shadow masks form three columns of virtual sub-pixel minimum repeating units on each of the two opposite sides of the display area 21. It is to be understood that the center distance between the first offset mark and the second offset mark is configured to be relatively small so that the distance between the offset marks can be appropriately reduced and the number of virtual sub-pixel minimum repeating units can also be reduced. In this manner, the width of the non-display area can be reduced, which is conducive to achieving a narrow bezel of the display panel.

Considering that there are different sub-pixel minimum repeating unit arrangements in other types of display panels, embodiments of the present disclosure further provide other types of display panels. According to the arrangement rule of the sub-pixel minimum repeating units, the center distance between the first offset mark A1 and the second offset mark A2 may be set to L1, the center distance between the first offset mark B1 and the second offset mark B2 may be set to L2, and the center distance between the first offset mark C1 and the second offset mark C2 may be set to L3, where L1, L2, and L3 satisfy L1=2L2=2L3, or L2=2L1=2L3, or L3=2L1=2L2.

Figure 23:
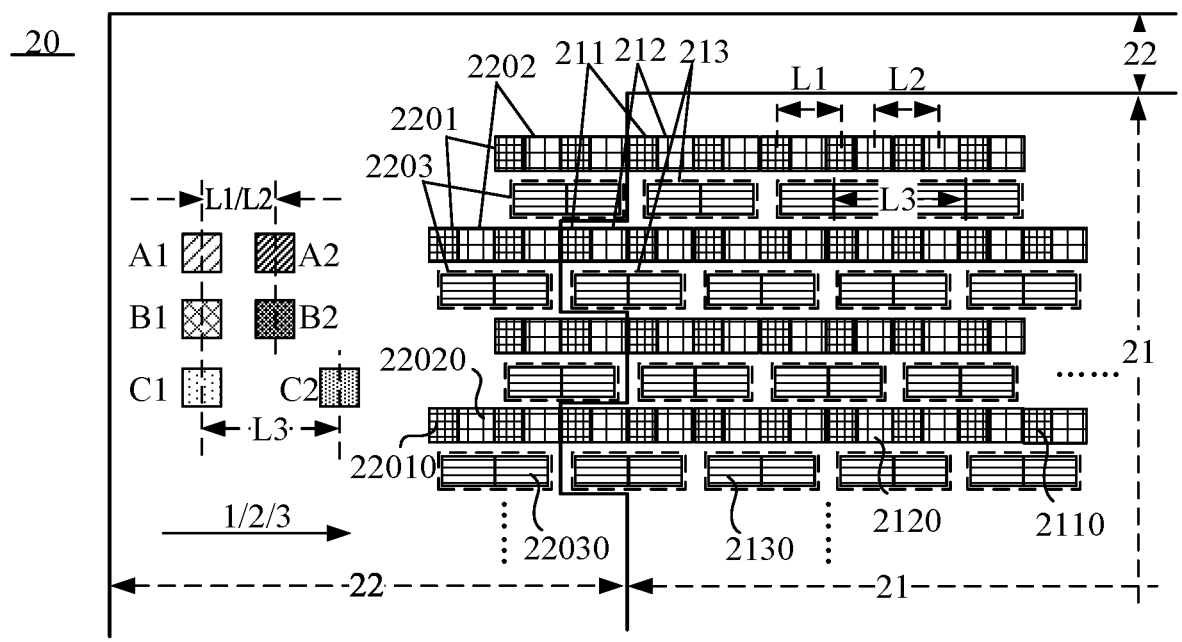
FIGS. 23 and 24 are partial structure diagrams of another two display panels according to an embodiment of the present disclosure.
Figure 24:
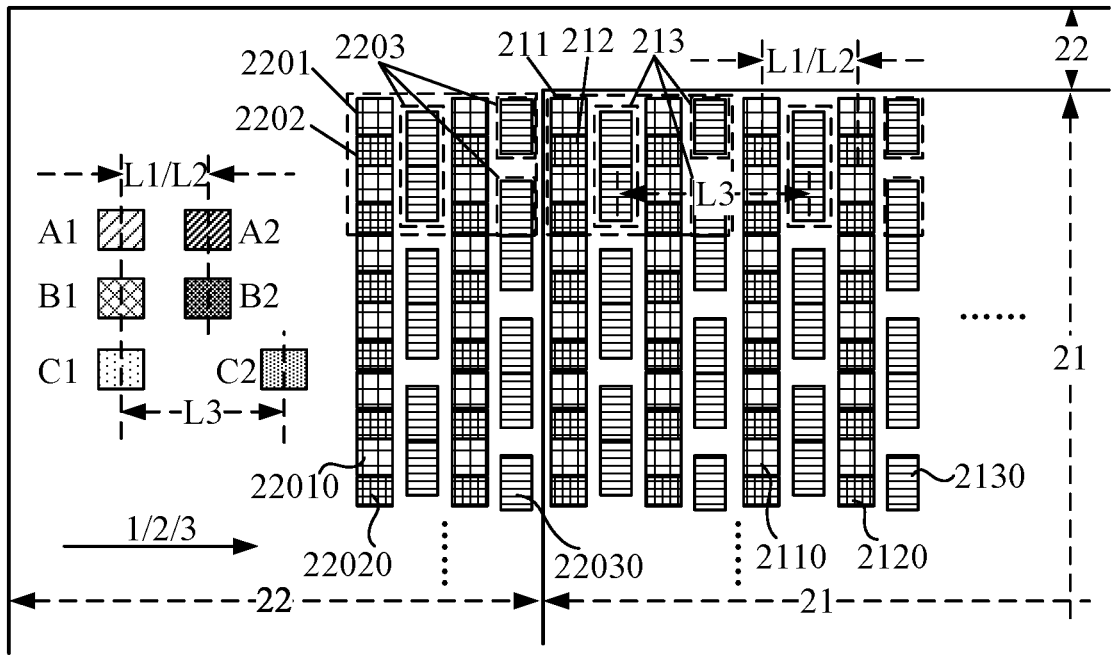

FIGS. 23 and 24 are partial structure diagrams of another two display panels according to an embodiment of the present disclosure. Referring to FIGS. 23 and 24, by way of example, in the display panel, the center distance between the first offset mark A1 and the second offset mark A2 is L1, the center distance between the first offset mark B1 and the second offset mark B2 is L2, and the center distance between the first offset mark C1 and the second offset mark C2 is L3, where L1, L2, and L3 satisfy L3=2L1=2L2.

In the two embodiments, due to the arrangement of the sub-pixels, the number of sub-pixels in each sub-pixel minimum repeating unit is not limited to one, and multiple sub-pixels may be included. FIG. 23 is used as an example. The first sub-pixel minimum repeating unit 211 includes first first sub-pixels 2110 in two adjacent rows, the second sub-pixel minimum repeating unit 212 includes first second sub-pixels 2120 in two adjacent rows, and the third sub-pixel minimum repeating unit 213 includes first two third sub-pixels 2130 in two adjacent rows. Apparently, in this embodiment, the first sub-pixel minimum repeating unit 211 includes two first sub-pixels 2110, the second sub-pixel minimum repeating unit 212 includes two second sub-pixels 2120, and the third sub-pixel minimum repeating unit 213 includes four third sub-pixels 2130. For the display panel shown in FIG. 24, the third sub-pixel minimum repeating unit 213 also includes four third sub-pixels 2130.

In this embodiment, the first offset mark A1 and the second offset mark A2 correspond to a red sub-pixel minimum repeating unit, that is, the first sub-pixel minimum repeating unit 211, the first offset mark B1 and the second offset mark B2 correspond to a green sub-pixel minimum repeating unit, that is, the second sub-pixel minimum repeating unit 212, and the first offset mark C1 and the second offset mark C2 correspond to a blue sub-pixel minimum repeating unit, that is, the third sub-pixel minimum repeating unit 213. In this display panel, the arrangement period of the red sub-pixel minimum repeating unit is equal to the arrangement period of the green sub-pixel minimum repeating unit, and the arrangement period of the blue sub-pixel minimum repeating unit is 2 times the arrangement period of the red sub-pixel minimum repeating unit or the arrangement period of the green sub-pixel minimum repeating unit. The arrangement period refers to the interval between any two adjacent sub-pixel minimum repeating units of the same color in the row direction or the column direction. As shown in FIGS. 23 and 24, in the row direction, the interval between two adjacent first sub-pixel minimum repeating units 211 is L1, and the interval between two adjacent third sub-pixel minimum repeating units 213 is L3. Apparently, the arrangement period of the third sub-pixel minimum repeating unit 213 is L3, which is twice the arrangement period L1 of the first sub-pixel minimum repeating unit 211. The third sub-pixel minimum repeating unit 213 corresponds to the first offset mark C1 and the second offset mark C2, and the first sub-pixel minimum repeating unit 211 corresponds to the first offset mark A1 and the second offset mark A2. Based on this, it is to be understood that, to ensure the accurate alignment of the third sub-pixel minimum repeating unit while the first offset mark C1 and the second offset mark C2 are formed in two evaporation processes, the center distance between the first offset mark C1 and the second offset mark C2 is an integral multiple of the arrangement period of the third sub-pixel minimum repeating unit 213, that is, L3=2L1=2L2.

Further, it is also necessary to describe the virtual sub-pixel minimum repeating units in the display panel shown in FIGS. 23 and 24. It is to be understood that sharing exists in three sub-pixels in the display area of the display panel shown in FIGS. 23 and 24. Specifically, each third sub-pixel 2130 corresponds to two first sub-pixels 2110 and two second sub-pixels 2120. When the five sub-pixels actually work, the five sub-pixels may form two pixel units, that is, the third sub-pixel 2130 needs to be shared. In this case, to ensure uniform light-emitting of the entire display panel and avoid moire fringes, the sub-pixels are misaligned. That is, as shown in FIG. 23, in the non-display area 22, the third virtual sub-pixels 22030 are arranged sequentially at equal intervals in the column direction and are misaligned in the row direction. The same applies for the first virtual sub-pixel minimum repeating unit 2201 and the second virtual sub-pixel minimum repeating unit 2202 and the misalignment also occurs in the row direction. It is to be understood that in this case, a boundary line between the display area 21 and the non-display area 22 of the display panel is actually in a zigzag form.

In the display panel of the preceding embodiment, each of the first sub-pixel minimum repeating unit, the second sub-pixel minimum repeating unit, and the third sub-pixel minimum repeating unit may be a respective one of the red sub-pixel minimum repeating unit, the green sub-pixel minimum repeating unit, or the blue sub-pixel minimum repeating unit, and the color of the first sub-pixel, the color of the second sub-pixel, and the color of the third sub-pixel are different. That is, in the actual preparation process, each of the first light-emitting layer, the second light-emitting layer, and the third light-emitting layer may be a respective one of a red light-emitting layer, a green light-emitting layer, or a blue light-emitting layer, and the first light-emitting layer, the second light-emitting layer, and the third light-emitting layer are different.

In an exemplary embodiment, the first sub-pixel minimum repeating unit 211 may be the red sub-pixel minimum repeating unit, the second sub-pixel minimum repeating unit 212 may be the green sub-pixel minimum repeating unit, and the third sub-pixel minimum repeating unit 213 may be the blue sub-pixel minimum repeating unit; the first sub-pixel minimum repeating unit 211 includes at least one red sub-pixel 2110, the second sub-pixel minimum repeating unit 212 includes at least one green sub-pixel 2120, and the third sub-pixel minimum repeating unit 213 includes at least one blue sub-pixel pixel 2130; the first offset mark A1 is a first red offset mark, the first offset mark B1 is a first green offset mark, and the first offset mark C1 is a first blue offset mark; the second offset mark A2 is a second red offset mark, the second offset mark B2 is a second green offset mark, and the second offset mark C2 is a second blue offset mark. Correspondingly, in the packaged evaporation shadow mask, the first evaporation shadow mask 11 is a red sub-pixel minimum repeating unit evaporation shadow mask, the second evaporation shadow mask 12 is a green sub-pixel minimum repeating unit evaporation shadow mask, and the third evaporation shadow mask 13 is a blue sub-pixel minimum repeating unit evaporation shadow mask.

Figure 25:
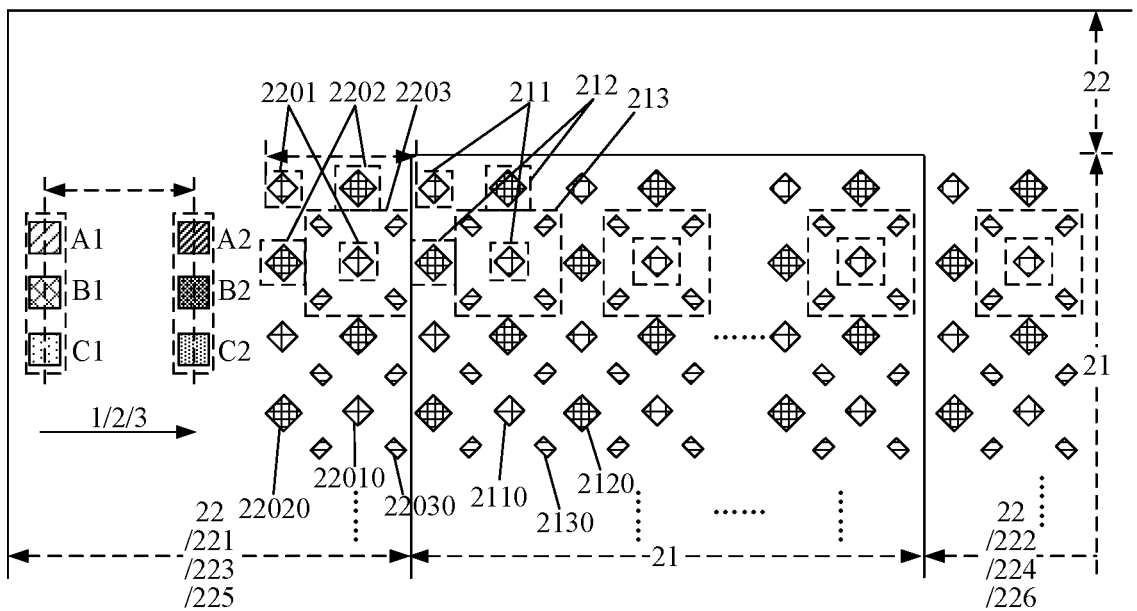
FIG. 25 is a partial structure diagram of another display panel according to an embodiment of the present disclosure.

The present disclosure further provides display panels with other sub-pixel arrangements. FIG. 25 is a partial structure diagram of another display panel according to an embodiment of the present disclosure. Referring to FIG. 25, by way of example, in the display panel, the first sub-pixel minimum repeating unit 211 includes two first sub-pixels 2110, the second sub-pixel minimum repeating unit 212 includes two second sub-pixels 2120, the third sub-pixel minimum repeating unit 213 includes four third sub-pixels 2130, and the first sub-pixel minimum repeating units 211, the second sub-pixel minimum repeating units 212, and the third sub-pixel minimum repeating units 213 are all periodically arranged in the row direction.

As described in the preceding embodiment, the first direction, the second direction, and the third direction mainly depend on the periodic arrangement direction of the sub-pixel minimum repeating units. In addition that the first direction, the second direction, and the third direction are the row direction or the column direction, embodiments of the present disclosure further provides other periodic arrangements of the sub-pixel minimum repeating units, that is, another display panel structure. Specifically, the first direction may be a direction that forms an angle of 45 degrees with the row direction of the display panel.

Figure 26:
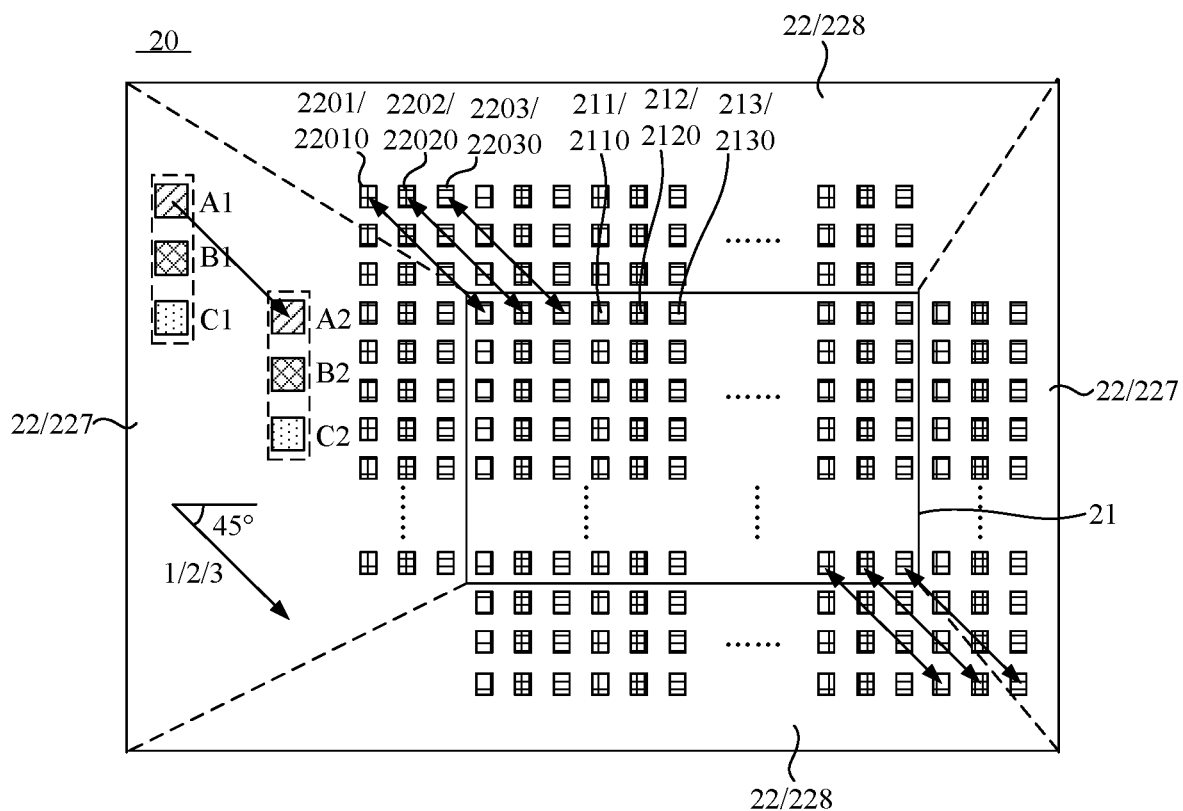
FIG. 26 is a partial structure diagram of another display panel according to an embodiment of the present disclosure.

FIG. 26 is a partial structure diagram of another display panel according to an embodiment of the present disclosure. Referring to FIG. 26, in the display panel, the first sub-pixel minimum repeating unit 211 includes one first sub-pixel 2110, the second sub-pixel minimum repeating unit 212 includes one second sub-pixel 2120, and the third sub-pixel minimum repeating unit 213 includes one third sub-pixel 2130. The non-display area 22 includes a seventh non-display area 227 and an eighth non-display area 228, and the seventh non-display area 227 and the eighth non-display area 228 are respectively located on two adjacent sides of the display area; each of the seventh non-display area 227 and the eighth non-display area 228 includes one group of first virtual sub-pixel minimum repeating units 2201, and each of the first virtual sub-pixel minimum repeating units 2201 includes at least one first virtual sub-pixel 22010.

One group of first virtual sub-pixel minimum repeating units 2201 are arranged sequentially in the row direction, another group of first virtual sub-pixel minimum repeating units 2201 are arranged sequentially in the column direction, and the two groups of first virtual sub-pixel minimum repeating units 2201 intersect at the same first virtual sub-pixel minimum repeating unit 2201 in an extension direction; the shape, size, and arrangement of the at least one first virtual sub-pixel 22010 in each of the first virtual sub-pixel minimum repeating units 2201 are exactly the same as the shape, size, and arrangement of the at least one first sub-pixel 2110 in a respective one of the first sub-pixel minimum repeating units 211.

First, the first sub-pixel minimum repeating units 211 in the display area 21 may be understood to be periodically arranged along a row direction or a column direction, or may also be understood to be periodically arranged along a direction that forms an angle of 45 degrees with the row direction. In this case, the arrangement period of the first sub-pixel minimum repeating units 211 in the direction that forms an angle of 45 degrees with the row direction may be set as d1. At the same time, the seventh non-display area 227 may be understood as areas on two sides of the display area 21 in the row direction, and the eighth non-display area 228 may be understood as areas on two sides of the display area 21 in the column direction. The seventh non-display area 227 and the eighth non-display area 228 are respectively provided with two groups of first virtual sub-pixel minimum repeating units 2201, and the same first virtual sub-pixel minimum repeating unit 2201 exists at the position where the two groups of first virtual sub-pixel minimum repeating units 2201 intersect in the extension direction. In this case, after passing by a distance of d1 in the direction that forms an angle of 45 degrees with the row direction, the first virtual sub-pixel minimum repeating units 2201 located in the non-display area 22, that is, the first virtual sub-pixel minimum repeating units 2201 located on the left side, upper side, and upper left side of the display area 21, can overlap with the first sub-pixel minimum repeating units 211 in the first row and the first column of the display area 21. At the same time, after passing by the distance of d1 in the direction that forms the angle of 45 degrees with the row direction, the first sub-pixel minimum repeating unit 211 located in the last row and low column of the display area 21 can overlap with the first virtual sub-pixel minimum repeating units 2201 in the non-display area 22, that is, the first virtual sub-pixel minimum repeating units 2201 located on the right side, lower side, and lower right side of the display area 21. At the same time, the distance between the first offset mark A1 and the second offset mark A2 located in the non-display area 22 in the direction that forms the angle of 45 degrees with the row direction is d1. It is to be understood that the first offset mark A1 and the second offset mark A2 are essentially formed when different film layers of the first sub-pixel 2110 are respectively prepared in two evaporation processes. In the two evaporation processes, the same evaporation shadow mask is used and moved by a distance of d1 in the direction that forms the angle of 45 degrees with the row direction. Further, by way of example, this embodiment also shows that the second sub-pixel minimum repeating units 212 and the third sub-pixel minimum repeating units 213, the second virtual sub-pixel minimum repeating units 2202 and the third virtual sub-pixel minimum repeating units 2203, the corresponding first offset marks B1 and C1, and the corresponding second offset marks B2 and C2 are included.

It is to be noted that in the display panel in this embodiment, the case where the evaporation shadow mask is moved by the distance of d1 in two evaporation processes is used as an example, so the distance between the first offset mark A1 and the second offset mark A2 is d1. Those skilled in the art can also set that the moving distance of the evaporation shadow mask in the direction the forms an angle of 45 degrees with the row direction in two evaporation processes is an integral multiple of the arrangement period d1 of the first sub-pixel minimum repeating unit 211.

Figure 27:
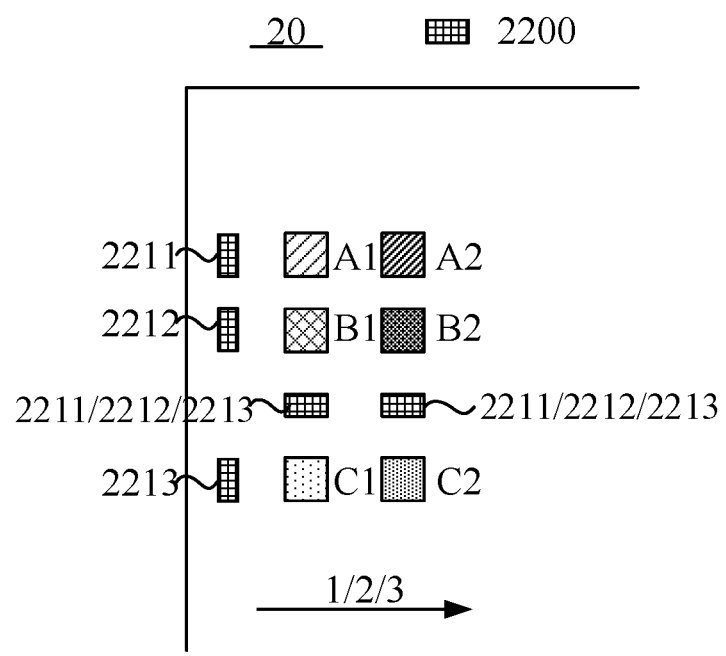
FIG. 27 is a partial structure diagram of another display panel according to an embodiment of the present disclosure.

In embodiments of the present disclosure, the offset mark is mainly used for the offset measurement. The offset mark is relatively small, and the graphic size of the offset mark is equivalent to the graphic size of the sub-pixel minimum repeating unit. Therefore, during the offset measurement, it is necessary to determine the position of the offset mark on the display panel. FIG. 27 is a partial structure diagram of another display panel according to an embodiment of the present disclosure. Referring to FIG. 27, based on the display panel provided in the preceding embodiments, the non-display area 22 may further include multiple alignment marks 2200, and the alignment marks 2200 are configured to determine the positions of the offset marks in the first offset mark group 25 and the second offset mark group 26. The alignment mark 2200 is a mark pattern simultaneously formed when a film layer such as a metal layer is prepared on the base substrate. The mark pattern is a mark with a special pattern, and thus when the image acquisition unit searches for an offset mark, the position of the offset mark can be quickly determined by the special mark pattern, and then the offset measurement is performed.

Specifically, the multiple alignment marks 2200 may include multiple bar-shaped marks, and the bar-shaped marks include a first bar-shaped mark 2211, a second bar-shaped mark 2212, and a third bar-shaped mark 2213. The line connecting the center of at least one first bar-shaped mark 2211 and the center of the first offset mark A1 or the second offset mark A2 is parallel to the first direction 1, the line connecting the center of at least one first bar-shaped mark 2211 and the center of the first offset mark A1 is perpendicular to the first direction 1, and the line connecting the center of at least one first bar-shaped mark 2211 and the center of the second offset mark A2 is perpendicular to the first direction 1. The line connecting the center of at least one second bar-shaped mark 2212 and the center of the first offset mark B1 or the second offset mark B2 is parallel to the second direction 2, the line connecting the center of at least one second bar-shaped mark 2212 and the center of the first offset mark B1 is perpendicular to the second direction 2, and the line connecting the center of at least one second bar-shaped mark 2212 and the center of the second offset mark B2 is perpendicular to the second direction 2. The line connecting the center of at least one third bar-shaped mark 2213 and the center of the first offset mark C1 or the second offset mark C2 is parallel to the third direction 3, the line connecting the center of at least one third bar-shaped mark 2213 and the center of the first offset mark C1 is perpendicular to the third direction 3, and the line connecting the center of at least one third bar-shaped mark 2213 and the center of the second offset mark C2 is perpendicular to the third direction 3.

The first bar-shaped mark 2211 is configured to determine the positions of the first offset mark A1 and the second offset mark A2 on the display panel, the second bar-shaped mark 2212 is configured to determine the positions of the first offset mark B1 and the second offset mark B2 on the display panel, and the third bar-shaped mark 2213 is configured to determine the positions of the first offset mark C1 and the second offset mark C2 on the display panel. The arrangement of the preceding bar-shaped marks is essentially that at least one bar-shaped mark is disposed on each of the row and column where the corresponding offset mark is located. The bar-shaped marks can be used to determine the row and column where the offset mark is located so that the exact position of the offset mark can be determined.

It is to be noted that in the display panel shown in FIG. 27, in the case where the positions of the offset marks are adjacent to each other, the bar-shaped marks may be shared. Since the first offset marks A1, B1, and C1 are arranged in the column direction, one bar-shaped mark may be provided to assist in determining the position of the column where the first offset marks A1, B1, and C1 are located. Similarly, for the second offset marks A2, B2, and C2, one bar-shaped mark may also be provided to assist in determining the position of the column where the second offset marks A2, B2, and C2 are located. Since the first offset mark A1 and the second offset mark A2 are arranged in the row direction, one bar-shaped mark may also be provided to assist in determining the position of the row where the two offset marks are located. The same applies for the first offset mark B1 and the second offset mark B2, and the first offset mark C1 and the second offset mark C2, which will not be repeated herein. It is to be noted that the positions of the shared bar-shaped marks as shown in FIG. 27 are only an example and may be set by those skilled in the art according to actual needs, which is not excessively limited herein.

Figure 28:
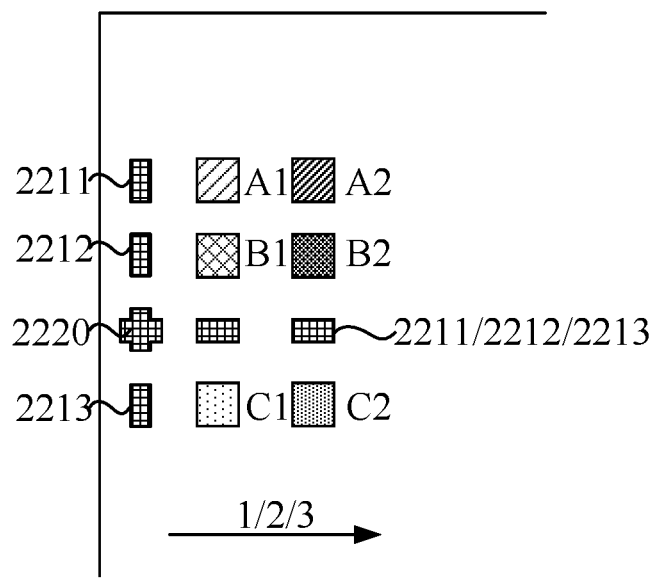
FIG. 28 is a partial structure diagram of another display panel according to an embodiment of the present disclosure.

Further, in another embodiment of the present disclosure, the alignment marks may include a cross-shaped mark. FIG. 28 is a partial structure diagram of another display panel according to an embodiment of the present disclosure. Referring to FIG. 28, based on the preceding display panel, the multiple alignment marks 2200 may further include at least one cross-shaped mark 2220; the line connecting the center of the at least one cross-shaped mark 2220 and the center of one first bar-shaped mark 2211 is parallel to the first direction 1, and the line connecting the center of the at least one cross-shaped mark 2220 and the center of another first bar-shaped mark 2211 is perpendicular to the first direction 1; the line connecting the center of at least one cross-shaped mark 2220 and the center of one second bar-shaped mark 2212 is parallel to the second direction 2, and the line connecting the center of at least one cross-shaped mark 2220 and the center of another second bar-shaped mark 2212 is perpendicular to the second direction 2; the line connecting the center of at least one cross-shaped mark 2220 and the center of one third bar-shaped mark 2213 is parallel to the third direction 3, and the line connecting the center of at least one cross-shaped mark 2220 and the center of another bar-shaped mark 2213 is perpendicular to the third direction 3.

It is to be understood that the cross-shaped mark has a more special pattern than the bar-shaped mark. Before the offset measure, the position of the offset mark can be quickly determined from an image by using the cross-shaped mark so that the speed of searching for the offset mark can be increased and the efficiency of the offset measure can be improved.

Figure 29:
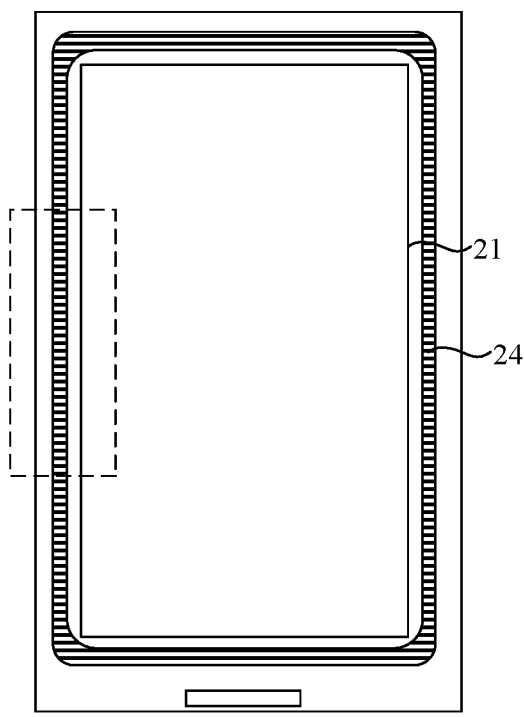
FIG. 29 is a structure diagram of another display panel according to an embodiment of the present disclosure.
Figure 30:
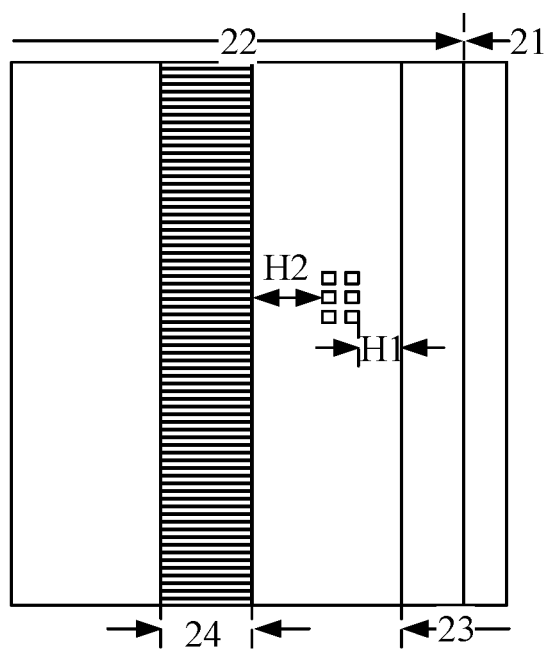
FIG. 30 is a partial enlarged diagram of the display panel shown in FIG. 29 at a dashed-line box.

FIG. 29 is a structure diagram of another display panel according to an embodiment of the present disclosure, and FIG. 30 is a partial enlarged diagram of the display panel shown in FIG. 29 at a dashed-line box. Referring to FIGS. 29 and 30, the display panel 20 further includes a common organic layer covering area 23, and the common organic layer covering area 23 covers the display area 21 and part of the non-display area 22. In embodiments of the present disclosure, the distance H1 between the offset mark closest to the common organic layer covering area 23 and the common organic layer covering area 23 may be set to be greater than or equal to 20 μm.

The common organic layer covering area 23 refers to a common organic film layer formed on the display panel when the sub-pixel minimum repeating units are prepared. Using the display panel shown in FIG. 1 as an example, a buffer layer, a hole injection layer, a hole transmission layer, a hole blocking layer, and an electron transmission layer are all common organic film layers, and such films are generally masked by using a large-opening evaporation shadow mask so that a covering layer is formed on the display panel to cover all the sub-pixel minimum repeating units. Therefore, it is to be understood that one common organic layer covering area 23 is formed on the display panel. The inventor found through research that in the case where the distance between the offset mark closest to the common organic layer covering area 23 and the common organic layer covering area 23 is not less than 20 μm, it can be ensured that even if the evaporation shadow mask is shifted to a certain degree, the organic film layer in the common organic layer covering area 23 can be prevented from overlapping with the offset marks and affecting the offset measurement of the offset marks; and at the same time, the influence of the offset marks on the performance of the organic film layer can be avoided.

With continued reference to FIGS. 29 and 30, the display panel 20 further includes a glass glue encapsulation area 24, and the glass glue encapsulation area 24 surrounds the display area 21. In embodiments of the present disclosure, the distance H2 between the offset mark closest to the glass glue encapsulation area 24 and the glass glue encapsulation area 24 may be greater than or equal to 50 μm.

For the OLED display panel, the organic material in the OLED unit is easily corroded by water and oxygen. To avoid the intrusion of water and oxygen, the OLED unit is generally encapsulated by using glass glue and a glass cover so that a closed space is formed. The glass glue encapsulation area 24 in this embodiment essentially refers to the area to which the glass glue is adhered, and the glass glue encapsulation area 24 surrounds the display area 21. Based on this, the inventor also found through research that in the case where the distance between the offset mark closest to the glass glue encapsulation area 24 and the glass glue encapsulation area 24 is greater than or equal to 50 μm, it can be ensured that even if the evaporation shadow mask is shifted, or when the glass glue is shifted, the glass glue encapsulation area 24 can still be prevented from overlapping with the offset mark overlapping. In this manner, the influence of the glass glue encapsulation area 24 on the offset measurement can be avoided.

Embodiments of the present disclosure further provide a display device. The display device includes any display panel of the preceding embodiments. Moreover, since the display panel adopts the array substrate described in the preceding embodiments, the display panel provided in embodiments of the present disclosure also has the same beneficial effects as the preceding array substrate. It is to be noted that the display device further includes other devices for supporting the normal operation of the display device. The display device may be any product or component with a display function, such as a mobile phone, a tablet computer, a television, an electronic paper, and an electronic photo frame.

It is to be noted that the preceding are only preferred embodiments of the present disclosure and the technical principles used therein. It will be appreciated by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising:
   a display area, wherein the display area comprises a plurality of first sub-pixel minimum repeating units; the plurality of first sub-pixel minimum repeating units are sequentially and periodically arranged in a first direction, and in the first direction, a center distance between any two adjacent ones of the plurality of first sub-pixel minimum repeating units is d1; each of the plurality of first sub-pixel minimum repeating units comprises at least one first sub-pixel; and
   a non-display area located at a periphery of the display area, wherein the non-display area comprises a first offset mark group and a second offset mark group, the first offset mark group comprises a first offset mark A1, and the second offset mark group comprises a second offset mark A2; the first offset mark A1 and the second offset mark A2 are arranged in the first direction, and a center distance L1 between the first offset mark A1 and the second offset mark A2 satisfies: L1=m×d1±t1, wherein t1 is a first preset offset value, and m is an integer greater than or equal to 1.

2. The display panel of claim 1, wherein
   the first direction is a row direction, a column direction, or a direction that forms an angle of 45 degrees with the row direction of the display panel.

3. The display panel of claim 1, wherein
   the first direction is a row direction or a column direction of the display panel; and
   the non-display area comprises a first non-display area and a second non-display area, and the first non-display area and the second non-display area are respectively located on two opposite sides of the display area in the first direction; each of the first non-display area and the second non-display area comprises one group of first virtual sub-pixel minimum repeating units, and each of the first virtual sub-pixel minimum repeating units comprises at least one first virtual sub-pixel; the one group of first virtual sub-pixel minimum repeating units are sequentially arranged in a direction perpendicular to the first direction, and a shape, size, and arrangement of the at least one first virtual sub-pixel in each of the first virtual sub-pixel minimum repeating units are exactly the same as a shape, size, and arrangement of the at least one first sub-pixel in a respective one of the plurality of first sub-pixel minimum repeating units.

4. The display panel of claim 3, wherein
   each of the at least one first sub-pixel in each of the plurality of first sub-pixel minimum repeating units comprises a first compensation layer and a first light-emitting layer that are stacked; and
   each of the at least one first virtual sub-pixel in each of the first virtual sub-pixel minimum repeating units located in the first non-display area comprises a first compensation layer and does not comprise a first light-emitting layer; each of the at least one first virtual sub-pixel in each of the first virtual sub-pixel minimum repeating units located in the second non-display area comprises a first light-emitting layer and does not comprise a first compensation layer.

5. The display panel of claim 4, wherein the first offset mark A1, the compensation layers of the first virtual sub-pixel minimum repeating units in the first non-display area and the compensation layers of the plurality of first sub-pixel minimum repeating units in the display area, and the second offset mark A2, the light-emitting layers of the first virtual sub-pixel minimum repeating units in the second non-display area and the light-emitting layers of the plurality of first sub-pixel minimum repeating units of the display area are prepared in different evaporation processes by using a same evaporation shadow mask.

6. The display panel of claim 4, wherein
   the display area further comprises a plurality of second sub-pixel minimum repeating units;
   the plurality of second sub-pixel minimum repeating units are sequentially and periodically arranged in a second direction, and in the second direction, a center distance between any two adjacent ones of the plurality of second sub-pixel minimum repeating units is d2;
   each of the plurality of second sub-pixel minimum repeating units comprises at least one second sub-pixel;
   a color of the at least one first sub-pixel is different from a color of the at least one second sub-pixel;
   the first offset mark group further comprises a first offset mark B1, and the second offset mark group further comprises a second offset mark B2; and
   the first offset mark B1 and the second offset mark B2 are arranged in the second direction, and a center distance L2 between the first offset mark B1 and the second offset mark B2 satisfies: L2=n×d2±t2, wherein t2 is a second preset offset value, and n is an integer greater than or equal to 1.

7. The display panel of claim 6, wherein
   the second direction is the row direction or the column direction of the display panel; and
   the non-display area comprises a third non-display area and a fourth non-display area, and the third non-display area and the fourth non-display area are respectively located on two opposite sides of the display area in the second direction; each of the third non-display area and the fourth non-display area comprises one group of second virtual sub-pixel minimum repeating units, and each of the second virtual sub-pixel minimum repeating units comprises at least one second virtual sub-pixel; the one group of second virtual sub-pixel minimum repeating units are sequentially arranged in a direction perpendicular to the second direction, and a shape, size, and arrangement of the second virtual sub-pixel minimum repeating units are exactly the same as a shape, size, and arrangement of the plurality of second sub-pixel minimum repeating units.

8. The display panel of claim 7, wherein
each of the at least one second sub-pixel in each of the plurality of second sub-pixel minimum repeating units comprises a second compensation layer and a second light-emitting layer that are stacked; and
each of the at least one second virtual sub-pixel in each of the second virtual sub-pixel minimum repeating units located in the third non-display area comprises a second compensation layer and does not comprise a second light-emitting layer; each of the at least one second virtual sub-pixel in each of the second virtual sub-pixel minimum repeating units located in the fourth non-display area comprises a second light-emitting layer and does not comprise a second compensation layer.

9. The display panel of claim 8, wherein
the first offset mark B1, the compensation layers of the second virtual sub-pixel minimum repeating units in the third non-display area and the compensation layers of the plurality of second sub-pixel minimum repeating units in the display area, and the second offset mark B2, the light-emitting layers of the second virtual sub-pixel minimum repeating units in the fourth non-display area and the light-emitting layers of the plurality of second sub-pixel minimum repeating units in the display area are prepared in different evaporation processes by using a same evaporation shadow mask.

10. The display panel of claim 8, wherein
the display area further comprises a plurality of third sub-pixel minimum repeating units;
the plurality of third sub-pixel minimum repeating units are sequentially and periodically arranged in a third direction, and in the third direction, a center distance between any two adjacent ones of the plurality of third sub-pixel minimum repeating units is d3;
each of the plurality of third sub-pixel minimum repeating units comprises at least one third sub-pixel;
the color of the at least one first sub-pixel, the color of the at least one second sub-pixel, and a color of the at least one third sub-pixel are different;
the first offset mark group further comprises a first offset mark C1, and the second offset mark group further comprises a second offset mark C2; and
the first offset mark C1 and the second offset mark C2 are arranged in the third direction, and a center distance L3 between the first offset mark C1 and the second offset mark C2 satisfies: L3=p×d3±t3, wherein t3 is a third preset offset value, and p is an integer greater than or equal to 1.

11. The display panel of claim 10, wherein
the third direction is the row direction or the column direction of the display panel; and
the non-display area comprises a fifth non-display area and a sixth non-display area, and the fifth non-display area and the sixth non-display area are respectively located on two opposite sides of the display area in the third direction; each of the fifth non-display area and the sixth non-display area comprises one group of third virtual sub-pixel minimum repeating units, and each of the third virtual sub-pixel minimum repeating units comprises at least one third virtual sub-pixel; the one group of third virtual sub-pixel minimum repeating units are sequentially arranged in a direction perpendicular to the third direction, and a shape, size, and arrangement of the third virtual sub-pixel minimum repeating units are exactly the same as a shape, size, and arrangement of the plurality of third sub-pixel minimum repeating units.

12. The display panel of claim 11, wherein each of the at least one third sub-pixel in each of the plurality of third sub-pixel minimum repeating units comprises a third compensation layer and a third light-emitting layer that are stacked; and
each of the at least one third virtual sub-pixel in each of the third virtual sub-pixel minimum repeating units located in the fifth non-display area comprises a third compensation layer and does not comprise a third light-emitting layer; each of the at least one third virtual sub-pixel in each of the third virtual sub-pixel minimum repeating units located in the sixth non-display area comprises a third light-emitting layer and does not comprise a third compensation layer.

13. The display panel of claim 12, wherein
the first offset mark C1, the compensation layers of the third virtual sub-pixel minimum repeating units in the fifth non-display area and the compensation layers of each of the plurality of third sub-pixel minimum repeating units of the display area, and the second offset mark C2, the light-emitting layers of the third virtual sub-pixel minimum repeating units in the sixth non-display area and the light-emitting layers of the plurality of third sub-pixel minimum repeating units in the display area are prepared in different evaporation processes by using a same evaporation shadow mask.

14. The display panel of claim 6, wherein the first direction is parallel to the second direction; and
the first offset mark A1 and the first offset mark B1 are arranged sequentially in the direction perpendicular to the first direction; the second offset mark A2 and the second offset mark B2 are arranged sequentially in the direction perpendicular to the first direction.

15. The display panel of claim 10, wherein the center distance between the first offset mark A1 and the second offset mark A2 is L1, the center distance between the first offset mark B1 and the second offset mark B2 is L2, and the center distance between the first offset mark C1 and the second offset mark C2 is L3, wherein L1, L2, and L3 satisfy L1=2L2=2L3, or L2=2L1=2L3, or L3=2L1=2L2.

16. The display panel of claim 10, wherein each of the plurality of first sub-pixel minimum repeating units is a red sub-pixel minimum repeating unit, each of the plurality of second sub-pixel minimum repeating units is a green sub-pixel minimum repeating unit, and each of the plurality of third sub-pixel minimum repeating units is a blue sub-pixel minimum repeating unit; each of the plurality of first sub-pixel minimum repeating units comprises at least one red sub-pixel, each of the plurality of second sub-pixel minimum repeating units comprises at least one green sub-pixel, and each of the plurality of third sub-pixel minimum repeating units comprises at least one blue sub-pixel; and
the first offset mark A1 is a first red offset mark, the first offset mark B1 is a first green offset mark, and the first offset mark C1 is a first blue offset mark.

17. The display panel of claim 6, wherein
the display area further comprises a plurality of third sub-pixels, the color of the at least one first sub-pixel, the color of the at least one second sub-pixel, and a color of the plurality of third sub-pixels are different; each of the plurality of third sub-pixels comprises a third light-emitting layer and does not comprise a compensation layer; and the non-display area further comprises a third offset mark C, and the third offset mark C and the third light-emitting layer of each of the plurality of third sub-pixels are prepared in a same evaporation process by using a same evaporation shadow mask.

18. The display panel of claim 1, wherein
the first direction is a direction that forms an angle of 45 degrees with a row direction of the display panel; and
the non-display area comprises a seventh non-display area and an eighth non-display area, and the seventh non-display area and the eighth non-display area are respectively located on two adjacent sides of the display area; each of the seventh non-display area and the eighth non-display area comprises one group of first virtual sub-pixel minimum repeating units, and each of the first virtual sub-pixel minimum repeating units comprises at least one first virtual sub-pixel,
wherein one of the two groups of first virtual sub-pixel minimum repeating units are arranged sequentially in the row direction, the other one of the two groups of first virtual sub-pixel minimum repeating units are arranged sequentially in a column direction, and the two groups of first virtual sub-pixel minimum repeating units intersect at a same one of the first virtual sub-pixel minimum repeating units in an extension direction; a shape, size, and arrangement of the at least one first virtual sub-pixel in each of the first virtual sub-pixel minimum repeating units are exactly the same as a shape, size, and arrangement of the at least one first sub-pixel in a respective one of the plurality of first sub-pixel minimum repeating units.

19. The display panel of claim 1, wherein the display panel further comprises a common organic layer covering area, the common organic layer covering area covers the display area, and a distance between an offset mark closest to the common organic layer covering area and the common organic layer covering area is greater than or equal to 20 μm.

20. A packaged evaporation shadow mask, wherein the display panel of claim 1 is formed through the packaged evaporation shadow mask; the packaged evaporation shadow mask comprises a first evaporation shadow mask,
wherein the first evaporation shadow mask comprises:
a first evaporation area, wherein the first evaporation area comprises a common area, a first shift area, and a second shift area, and the first shift area and the second shift area are respectively located on two opposite sides of the common area; the common area, the first shift area, and the second shift area are each provided with a plurality of sub-pixel minimum repeating unit openings with exactly a same shape and a same size, and each of the plurality of sub-pixel minimum repeating unit openings comprises at least one sub-pixel opening; a sub-pixel minimum repeating unit opening pattern formed by the sub-pixel minimum repeating unit openings in the first shift area and the common area is the same as a sub-pixel minimum repeating unit opening pattern formed by the sub-pixel minimum repeating unit openings in the common area and the second shift area; and
a second evaporation area located at a periphery of the first evaporation area, wherein the second evaporation area comprises an offset mark opening,
wherein the sub-pixel minimum repeating unit openings of the first shift area and the common area of the first evaporation shadow mask have exactly the same shape, size, and number as the plurality of first sub-pixel minimum repeating units in the display panel, and are aligned in one-to-one correspondence with the plurality of first sub-pixel minimum repeating units in the display panel; and
the offset mark opening in the first evaporation shadow mask is configured to form the first offset mark A1 and the second offset mark A2 in the display panel.

21. The packaged evaporation shadow mask of claim 20, wherein the packaged evaporation shadow mask further comprises a second evaporation shadow mask,
wherein the second evaporation shadow mask comprises:
a first evaporation area, wherein the first evaporation area comprises a common area, a first shift area, and a second shift area, and the first shift area and the second shift area are respectively located on two opposite sides of the common area; the common area, the first shift area, and the second shift area are each provided with a plurality of sub-pixel minimum repeating unit openings with exactly a same shape and a same size, and each of the plurality of sub-pixel minimum repeating unit openings comprises at least one sub-pixel opening; a sub-pixel minimum repeating unit opening pattern formed by the sub-pixel minimum repeating unit openings in the first shift area and the common area is the same as a sub-pixel minimum repeating unit opening pattern formed by the sub-pixel minimum repeating unit openings in the common area and the second shift area; and
a second evaporation area located at a periphery of the first evaporation area, wherein the second evaporation area comprises an offset mark opening,
wherein the sub-pixel minimum repeating unit openings in the first shift area and the common area of the second evaporation shadow mask have exactly the same shape, size, and number as the plurality of second sub-pixel minimum repeating units in the display panel, and are aligned in one-to-one correspondence the plurality of second sub-pixel minimum repeating units in the display panel; and
the offset mark opening in the second evaporation shadow mask is configured to form the first offset mark B1 and the second offset mark B2 in the display panel.

22. The packaged evaporation shadow mask of claim 21, wherein the packaged evaporation shadow mask further comprises a third evaporation shadow mask,
wherein the third evaporation shadow mask comprises:
a first evaporation area, wherein the first evaporation area comprises a common area, a first shift area, and a second shift area, and the first shift area and the second shift area are respectively located on two opposite sides of the common area; the common area, the first shift area, and the second shift area are each provided with a plurality of sub-pixel minimum repeating unit openings with exactly a same shape and a same size, and each of the plurality of sub-pixel minimum repeating unit openings comprises at least one sub-pixel opening; a sub-pixel minimum repeating unit opening pattern formed by the sub-pixel minimum repeating unit openings in the first shift area and the common area is the same as a sub-pixel minimum repeating unit opening pattern formed by the sub-pixel minimum repeating unit openings in the common area and the second shift area; and
a second evaporation area located at a periphery of the first evaporation area, wherein the second evaporation area comprises an offset mark opening,
wherein the sub-pixel minimum repeating unit openings in the first shift area and the common area of the third evaporation shadow mask have exactly the same shape, size, and number as the plurality of third sub-pixel minimum repeating units in the display panel, and are aligned in one-to-one correspondence with the plurality of third sub-pixel minimum repeating units in the display panel; and the offset mark opening in the third evaporation shadow mask is configured to form the first offset mark C1 and the second offset mark C2 in the display panel.

23. The packaged evaporation shadow mask of claim 22, wherein each of the plurality of first sub-pixel minimum repeating units is a red sub-pixel minimum repeating unit, each of the plurality of second sub-pixel minimum repeating units is a green sub-pixel minimum repeating unit, and each of the plurality of third sub-pixel minimum repeating units is a blue sub-pixel minimum repeating unit; and the first evaporation shadow mask is a red sub-pixel minimum repeating unit evaporation shadow mask, the second evaporation shadow mask is a green sub-pixel minimum repeating unit evaporation shadow mask, and the third evaporation shadow mask is a blue sub-pixel minimum repeating unit evaporation shadow mask.

24. A method for preparing the display panel of claim 1 with the packaged evaporation shadow mask of claim 20, the method comprising:

providing a base substrate;

depositing a first compensation layer on the base substrate by using a first evaporation shadow mask in the packaged evaporation shadow mask according to a sub-pixel minimum repeating unit opening pattern, with a first offset mark A1 formed at the same time; and moving the first evaporation shadow mask by a distance of m×d1 in a first direction, and depositing a first light-emitting layer on the base substrate according to the sub-pixel minimum repeating unit opening pattern, with a second offset mark A2 formed at the same time, wherein d1 is a center distance between any two adjacent ones of sub-pixel minimum repeating unit openings in the first evaporation shadow mask in the first direction, and m is an integer greater than or equal to 1.

25. The method of claim 24, wherein the packaged evaporation shadow mask further comprises a second evaporation shadow mask, wherein the second evaporation shadow mask comprises:

a first evaporation area, wherein the first evaporation area comprises a common area, a first shift area, and a second shift area, and the first shift area and the second shift area are respectively located on two opposite sides of the common area; the common area, the first shift area, and the second shift area are each provided with a plurality of sub-pixel minimum repeating unit openings with exactly a same shape and a same size, and each of the plurality of sub-pixel minimum repeating unit openings comprises at least one sub-pixel opening; a sub-pixel minimum repeating unit opening pattern formed by the sub-pixel minimum repeating unit openings in the first shift area and the common area is the same as a sub-pixel minimum repeating unit opening pattern formed by the sub-pixel minimum repeating unit openings in the common area and the second shift area; and a second evaporation area located at a periphery of the first evaporation area, wherein the second evaporation area comprises an offset mark opening, wherein the sub-pixel minimum repeating unit openings of the first shift area and the common area of the second evaporation shadow mask have exactly the same shape, size, and number as the plurality of second sub-pixel minimum repeating units in the display panel, and are aligned in one-to-one correspondence with the plurality of second sub-pixel minimum repeating units in the display panel; and the offset mark opening in the second evaporation shadow mask is configured to form a first offset mark B1 and a second offset mark B2 in the display panel;

wherein the method for preparing the display panel further comprises:

depositing a second compensation layer on the base substrate by using the second evaporation shadow mask in the packaged evaporation shadow mask according to a sub-pixel minimum repeating unit opening pattern, with the first offset mark B1 formed at the same time; and moving the second evaporation shadow mask by a distance of n×d2 in a second direction, and depositing a second light-emitting layer on the base substrate according to the sub-pixel minimum repeating unit opening pattern, with the second offset mark B2 formed at the same time, wherein d2 is a center distance between any two adjacent ones of sub-pixel minimum repeating unit openings in the second evaporation shadow mask in the second direction, and n is an integer greater than or equal to 1.

26. The method of claim 25, wherein the packaged evaporation shadow mask further comprises a third evaporation shadow mask, wherein the third evaporation shadow mask comprising:

a first evaporation area, wherein the first evaporation area comprises a common area, a first shift area, and a second shift area, and the first shift area and the second shift area are respectively located on two opposite sides of the common area; the common area, the first shift area, and the second shift area are each provided with a plurality of sub-pixel minimum repeating unit openings with exactly a same shape and a same size, and each of the plurality of sub-pixel minimum repeating unit openings comprises at least one sub-pixel opening; a sub-pixel minimum repeating unit opening pattern formed by the sub-pixel minimum repeating unit openings in the first shift area and the common area is the same as a sub-pixel minimum repeating unit opening pattern formed by the sub-pixel minimum repeating unit openings in the common area and the second shift area; and a second evaporation area located at a periphery of the first evaporation area, wherein the second evaporation area comprises an offset mark opening, wherein the sub-pixel minimum repeating unit openings of the first shift area and the common area of the third evaporation shadow mask have exactly the same shape, size, and number as the plurality of third sub-pixel minimum repeating units in the display panel, and are aligned in one-to-one correspondence with the plurality of third sub-pixel minimum repeating units in the display panel; and the offset mark opening in the third evaporation shadow mask is configured to form a first offset mark C1 and a second offset mark C2 in the display panel;

wherein the preparation method of the display panel further comprising:

depositing a third compensation layer on the base substrate by using the third evaporation shadow mask in the packaged evaporation shadow mask according to a sub-pixel minimum repeating unit opening pattern, with the first offset mark C1 formed at the same time; and moving the third evaporation shadow mask by a distance of p×d3 in a third direction, and depositing a third light-emitting layer on the base substrate according to the sub-pixel minimum repeating unit opening pattern, with the second offset mark C2 formed at the same time, wherein d3 is a center distance between any two adjacent ones of sub-pixel minimum repeating unit openings in the third evaporation shadow mask in the third direction, and p is an integer greater than or equal to 1.

27. The method of claim 26, wherein each of the first direction, the second direction and the third direction is a row direction, a column direction, or a direction that forms an angle of 45 degrees with the row direction of the display panel.

28. A display device comprising the display panel of claim 1.

\* \* \* \* \*